US012677602B1

(12) United States Patent
Friedman et al.

(10) Patent No.:    US 12,677,602 B1
(45) Date of Patent:        Jul. 7, 2026

(54) DEVICE AND METHOD FOR HIGH SPEED METAMAGNETIC RESISTIVE SWITCHING

(71) Applicant: The Government of the United States as represented by the Director, National Security Agency, Ft. George G. Meade, MD (US)

(72) Inventors: Adam L. Friedman, Silver Spring, MD (US); Aubrey T. Hanbicki, Washington, DC (US); Nicholas A. Blumenschein, Silver Spring, MD (US); Gregory M. Stephen, College Park, MD (US); Steven P. Bennett, Owings, MD (US); Cory D. Cress, Springfield, VA (US); Samuel LaGasse, Waldorf, MD (US)

(73) Assignee: The Government of the United States as represented by the Director, National Security Agency, Ft. George G. Meade, MD (US)

(*) Notice: Subject to any disclaimer, the term of this patent is extended or adjusted under 35 U.S.C. 154(b) by 423 days.

(21) Appl. No.: 18/215,380

(22) Filed: Jun. 28, 2023

Related U.S. Application Data

(60) Provisional application No. 63/405,313, filed on Sep. 9, 2022, provisional application No. 63/375,175, filed (Continued)

(51) Int. Cl.
    H10N 70/20        (2023.01)
    G11C 11/16        (2006.01)
    (Continued)

(52) U.S. Cl.
    CPC ............ H10N 70/20 (2023.02); G11C 11/16 (2013.01); H01F 1/047 (2013.01); H01F 10/002 (2013.01);
    (Continued)

(58) Field of Classification Search
    CPC .... H10N 70/231; H10N 70/881; H10N 70/20; H10N 50/10; H10N 70/026;
    (Continued)

(56) References Cited

U.S. PATENT DOCUMENTS

2007/0253243 A1* 11/2007 Fontana .............. G11C 11/1675
                                                    365/171
2008/0106293 A1*  5/2008 Hashimoto ............. F25B 21/02
                                                    62/3.3

(Continued)

OTHER PUBLICATIONS

Lee, Y., Liu, Z., Heron, J. et al. Large resistivity modulation in mixed-phase metallic systems. Nat Commun 6, 5959 (2015). https://doi.org/10.1038/ncomms6959 (Year: 2015).*

(Continued)

*Primary Examiner* — Eliseo Ramos Feliciano
*Assistant Examiner* — Brad A Knudson

(57)                ABSTRACT

A device and method for high speed metamagnetic resistive switching provides a metamagnetic phase transitioning (MPT) portion formed on a substrate between terminals. The MPT portion is tuned for temperature-responsive transitions between magnetic phases through a transition phase. The phases are delineated by phase boundaries each traversed at different critical temperatures depending on direction of traversal. The critical temperatures of each phase boundary are mutually offset by a hysteretic shift. The MPT portion is boosted across one phase boundary responsive to thermal actuation pulsed in a first direction to reach or exceed both critical temperatures of that phase boundary in the first direction, and boosted across the other phase boundary responsive to thermal actuation pulsed in a second direction to reach or exceed both critical temperatures of that phase boundary in the second direction. The electrical conduction path is thereby adjusted in resistivity for switching between ON and OFF states.

20 Claims, 12 Drawing Sheets

Related U.S. Application Data on Sep. 9, 2022, provisional application No. 63/405,005, filed on Sep. 9, 2022, provisional application No. 63/356,126, filed on Jun. 28, 2022.

(51) Int. Cl.

| | |
|---|---|
| *H01F 1/047* | (2006.01) |
| *H01F 10/00* | (2006.01) |
| *H01F 10/13* | (2006.01) |
| *H10N 50/10* | (2023.01) |
| *H10N 70/00* | (2023.01) |
| *G11C 13/00* | (2006.01) |
| *H01F 1/00* | (2006.01) |
| *H10B 63/00* | (2023.01) |

(52) U.S. Cl.
CPC ........... *H01F 10/136* (2013.01); *H10N 50/10* (2023.02); *H10N 70/881* (2023.02); *G11C 13/0002* (2013.01); *H01F 1/00* (2013.01); *H10B 63/20* (2023.02); *H10N 70/026* (2023.02); *H10N 70/257* (2023.02)

(58) Field of Classification Search
CPC ........ H10N 70/257; H10B 63/20; H01F 1/00; H01F 1/047; H01F 10/002; H01F 10/136; G11C 11/16; G11C 13/0002
See application file for complete search history.

(56) References Cited

U.S. PATENT DOCUMENTS

| | | | |
|---|---|---|---|
| 2009/0097300 A1* | 4/2009 | Ishihara | H10N 70/8833 |
| | | | 29/610.1 |
| 2009/0237987 A1* | 9/2009 | Zhu | G11C 11/15 |
| | | | 365/171 |
| 2020/0388750 A1* | 12/2020 | Mei | H10N 50/85 |

OTHER PUBLICATIONS

Matsuzaki, Noriko et al.; Current induced antiferro-ferromagnetic transition in FeRh nanowires; Japanese Journal of Applied Physics; 2015; pp. 073002-1 to 073002-3; vol. 54; The Japan Society of Applied Physics.

Feng, Zexin et al.; Electric-Field Control of Magnetic Order: From FeRh to Topological Antiferromagnetic Spintronics; Advanced Electronic Materials; 2019; p. 1800466 (1 to 14); vol. 5, Wiley-VCH Verlag Gmbh & Co. KGaA, Weinheim (doi: 10.1002/aelm. 201800466).

Pressacco, Federico et al.; Subpicosecond metamagnetic phase transition in FeRh driven by non-equilibrium electron dynamics; Nature Communications; 2021, pp. 1-8; 12:5088 (https://www.nature.com/articles/s41467-021-25347-3).

* cited by examiner

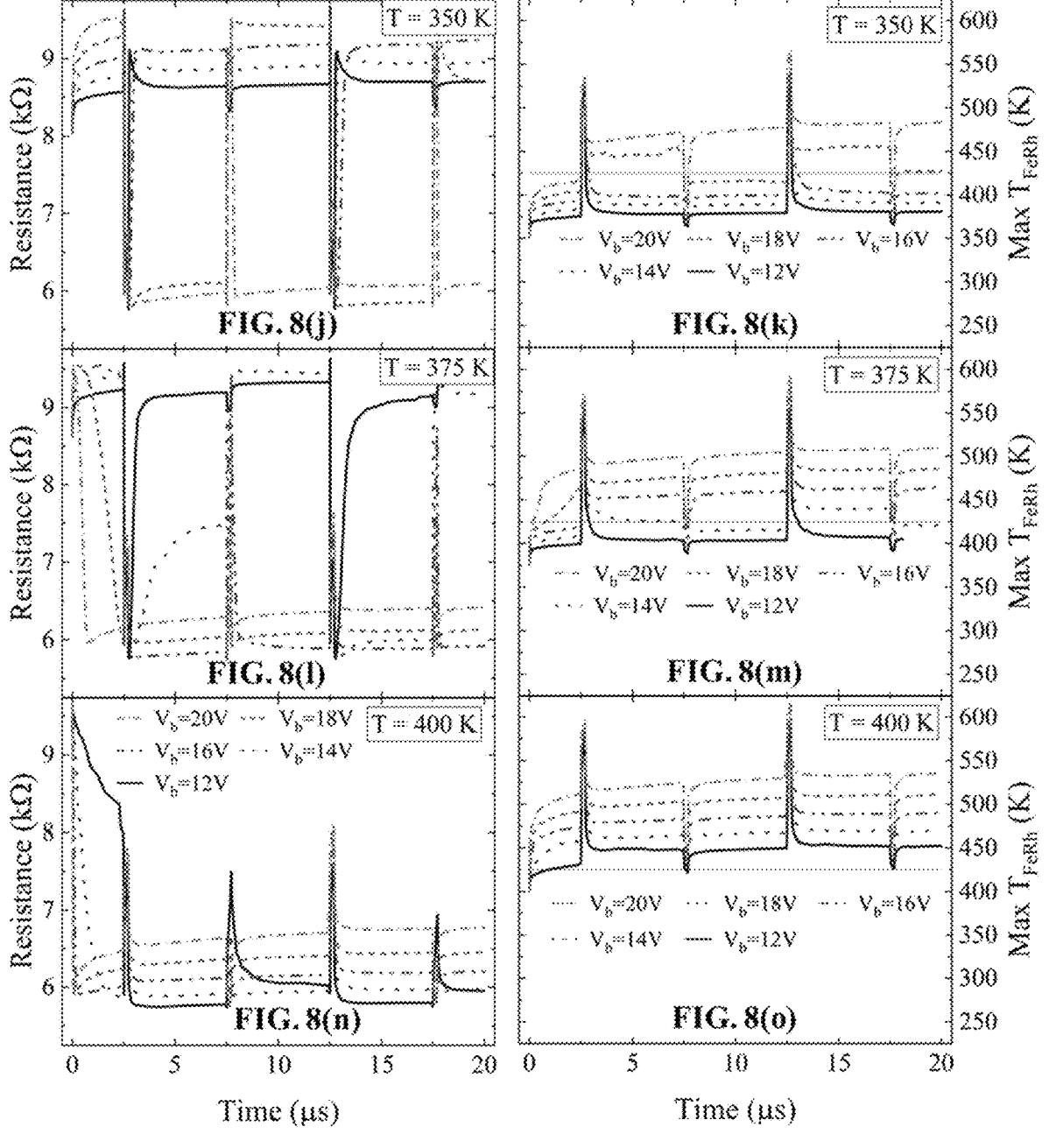

DEVICE AND METHOD FOR HIGH SPEED METAMAGNETIC RESISTIVE SWITCHING

CROSS REFERENCE TO RELATED APPLICATIONS

This application is based on the following provisional patent applications: U.S. application Ser. No. 63/356,126 directed to "High Speed Resistive Switching Metamagnetic Memristive Memory Element" filed 28 Jun. 2022; Appl. No. 63/405,005 directed to "High Speed Resistive Switching Metamagnetic Memristive Memory Element" filed 9 Sep. 2022; Appl. No. 63/405,313 directed to "High Speed Resistive Switching Metamagnetic Memristive Memory Element" filed 9 Sep. 2022; and, Appl. No. 63/375,175 directed to "High Speed Resistive Switching Metamagnetic Memristive Memory Element" also filed 9 Sep. 2022. The contents of these applications are hereby incorporated by reference herein in their entirety.

FIELD OF THE INVENTION

The present invention is generally directed to a device and method for use in memory or other suitable applications requiring high speed switching. More specifically, the present invention is generally directed to high speed switching devices and method of establishing and controlling the same. The device and method employ a suitable metallic material having metamagnetic transition properties that exhibit hysteretic response to thermal conditions. The device and method in certain applications employ such metallic material which is formed to define a conduction path, and which may be controlled in metamagnetic transition to effect a corresponding change in resistance through the conduction path. The device and method in certain applications employ pulsed actuation to control the metamagnetic transition and induce a consequent change in resistance. Fast and reliable transitions between predefined ON and OFF states are effected thereby.

BACKGROUND OF THE INVENTION

Magnetic materials offer notable advantages for use in switching devices because of their inherent non-volatility, radiation hardness, and ease of control. The advantages of using magnetization as a state variable in such switching devices rather than electric charge include, among other things, speed. The resonant frequencies within magnetic materials are faster by an order of magnitude or more than within other materials typically employed, for example, in known memory applications such as DRAM technologies (gigahertz frequencies in ferromagnets and terahertz frequencies in antiferromagnets).

Known magnetic devices for memory applications generally rely on manipulating the magnetic moment direction. Although known schemes in that regard are nonvolatile, it is difficult to distinguish between on/off states in the resulting devices. Other prospective MRAM technologies known in the art rely on switching magnetic tunnel junctions with spin transfer torque. But those technologies would require high currents to switch a free magnetic layer, which would tend to prematurely degrade the tunnel barrier and render the given devices inoperable.

An alternate approach known in the art is to toggle the magnetization state of magnetization-based devices by switching between ferromagnetic (FM) and antiferromagnetic (AFM) phases, for example, to realize clear and distinct on/off states of a given phase-change device. Such phase-change memory (PCM) devices are typically operated based on the resistivity contrast of insulating amorphous and conductive crystalline phases. Indeed, PCM devices capable of faster write times and higher endurance than traditional NAND memory are realizable.

Memory and logic elements with bistable states offer another prospective technology of interest, if their switching excitations could be kept near the activation energies of their phase transitions. Certain bistable transistors could be envisioned for numerous neuromorphic computing architecture applications, but existing devices as a practical matter tend to be prohibitively slow and lithographically complicated.

Reconfigurable logic and neuromorphic computing architectures are of recognized importance in the art for the development of the next-generation of high-speed, high-efficiency computing. Traditional logic using conventional metal-oxide-semiconductor technology is limited to the reconfigurability of the field-effect transistor (FET) in semiconductors, which is physically limited in scale and efficiency and thereby presents a bottleneck for next-generation high performance computing applications.

With respect to memory applications, the ability to store data in random access memory elements, both static and dynamic, is a fundamental component of information processing. In von Neumann architecture based digital computing, the central processing unit (CPU) includes a control unit and an arithmetic/logic unit that serially process data from an input device, which is fed to an output device. To perform the necessary functions, each processing step of the CPU begins with a read operation of the memory unit followed by a write operation to the memory unit. Over time, CPUs have become parallelized, and the underlying electronics have increased in speed. The amount of data that must be read and written to memory has accordingly increased at an exponential pace, leading to the so-called von Neumann bottleneck, where read and write speeds of random-access memory elements are severely lacking.

An entirely different computing paradigm referred to as neuromorphic computing seeks to avoid this von Neumann bottleneck. Neuromorphic computing employs a range of analog circuits integrated in a network-like architecture in an attempt to mimic biological neural-brain function. Neurons, the fundamental elements of biological computation, operate based on action potentials where an input signal yields no output until the action potential is reached. Once reached, the response is large and abrupt, leading to a voltage pulse that travels down the neuron and interacts with other neurons. Voltage pulses may continue to propagate or may be suppressed, depending on the timing of all pulses received by a terminal neuron. Such pulse-dependent functioning, referred to as spike-timing, is a form of neuromorphic computation. With the appropriate circuit and network design, integrated circuits based on metal-oxide memristors, phase change memories, threshold switches, and transistors have all been used to successfully achieve neuromorphic-like computation.

Known resistive switch technologies (including memristors and PCM devices) generally utilize a current pulse induced resistance change that leaves the device in a new resistance state, either a high resistance or a low resistance. In metal-oxide based memristors, the underlying mechanism inducing the change is related to ionic or vacancy motion which leads to the formation of a conductive filament. A current pulse with one polarity can drive the mobile species in one direction forming the filament. Conversely, a current pulse with the opposite polarity drives the mobile species away in a direction breaking the filament. A critical aspect of known technologies like this is the transition from a pristine to highly defective state (metal-oxide memristor) or a highly crystalline to amorphous state (PCM). But such known technologies rely generally on semiconducting materials which are highly sensitive to impurities and can degrade due to stoichiometry changes over time.

Hence, there is a need for high speed resistive switching measures, which employ a metallic material for metamagnetic transitioning between states. There is a need for such measures where the transitioning between states is clear and distinct, and is easily and reliably controllable in nonvolatile manner. There is a need for such measures which are realized with simple device geometry, and whose switching is easily and efficiently actuated.

SUMMARY OF THE INVENTION

It is an object of the present invention to provide high speed resistive switching between states responsive to metamagnetic transitioning of a metallic material.

It is another object of the present invention to provide high speed metamagnetic resistive switching with clear and distinct switching between states.

It is yet another object of the present invention to provide high speed metamagnetic resistive switching through a device having simple geometry.

It is still another object of the present invention to provide high speed metamagnetic resistive switching which is easily and efficiently actuated.

These and other objectives are attained by a device for high speed metamagnetic resistive switching comprising a substrate, first and second terminals formed on the substrate, and at least one metamagnetic phase transitioning (MPT) portion formed on the substrate. The MPT portion is coupled to the first and second terminals to define an electrical conduction path in resistivity adjustable manner therebetween. The MPT portion is selectively tuned for temperature-responsive phase transitions bidirectionally between predetermined first and second magnetic phases through an intermediate phase, with first and second phase boundaries being defined between the intermediate phase and the first and second magnetic phases respectively. The first and second phase boundaries are each traversed at different critical temperatures depending on direction of traversal, the different critical temperatures for each of the first and second phase boundaries being mutually offset by a hysteretic shift. The MPT portion is boosted in magnetic phase across the first phase boundary responsive to thermal actuation pulsed in a first direction to reach or exceed both the critical temperatures of the first phase boundary in the first direction, and boosted across the second phase boundary responsive to thermal actuation pulsed in a second direction to reach or exceed both the different critical temperatures of the second phase boundary in the second direction. The electrical conduction path of the MPT portion is thereby adjusted in resistivity for switching between ON and OFF states.

In accordance with certain other embodiments, a two terminal switching device having high speed metamagnetic resistive switching between predetermined ON and OFF states for memory is provided. The switching device comprises a substrate, first and second terminals formed on the substrate, and at least one MPT portion formed on the substrate. The MPT portion is formed of a metallic material and coupled to the first and second terminals to define an electrical conduction path in resistivity adjustable manner therebetween.

The MPT portion is selectively tuned for temperature-responsive bidirectional transitions in phase between anti-ferromagnetic (AFM) and ferromagnetic (FM) phases through an intermediate phase, a first phase boundaries being defined between the AFM and intermediate phases and a second phase boundary between the intermediate phase and FM phases. The first and second phase boundaries are each traversed at different critical temperatures depending on direction of traversal, the different critical temperatures for each of the first and second phase boundaries being mutually offset by a hysteretic shift. The MPT portion is driven in magnetic phase between the intermediate and FM phases to switch the electrical conduction path in resistivity from the OFF state to the ON state responsive to pulsed energization for raising the MPT portion in temperature up to at least the higher of the critical temperatures for the second boundary. The MPT portion is driven in magnetic phase between the intermediate and AFM phases to switch the electrical conduction path in resistivity from the ON state to the OFF state responsive to pulsed energization for lowering the MPT portion in temperature down to at least the lower of the critical temperatures for the first boundary.

In accordance with certain additional embodiments, a method for high speed metamagnetic resistive switching between predetermined ON and OFF states for memory is provided. The method comprises establishing a substrate, establishing first and second terminals on said substrate, and forming at least one MPT portion on the substrate. The MPT portion is coupled to the first and second terminals to define an electrical conduction path in resistivity adjustable manner therebetween. The MPT portion is selectively tuned for temperature-responsive bidirectional transitions in phase between AFM and FM phases through an intermediate phase. The selective tuning includes defining first and second phase boundaries between the intermediate phase and the AFM and FM phases respectively. The selective tuning also includes defining for each of the first and second phase boundaries different critical temperatures for traversal depending on direction of traversal, where the different critical temperatures for each of the first and second phase boundaries are mutually offset by a hysteretic shift. The MPT portion is boosted in magnetic phase across the first phase boundary responsive to thermal actuation pulsed in a first direction to reach or exceed both the critical temperatures of the first phase boundary in the first direction. The MPT portion is boosted in magnetic phase across the second phase boundary responsive to thermal actuation pulsed in a second direction to reach or exceed both the critical temperatures of the second phase boundary in the second direction. The electrical conduction path of the MPT portion is thereby adjusted in resistivity for switching between the ON and OFF states.

BRIEF DESCRIPTION OF THE DRAWINGS

Various aspects of the present invention, as well as the structural and operational features of certain exemplary embodiments disclosed herein, may be better understood by reference to the following description, taken in connection with the accompanying drawings, wherein like reference numerals and characters identify like elements, in which:

FIG. 1(a) is a plan view diagram, partially enlarged, of a plurality of switching devices formed in accordance with one exemplary embodiment of the present invention;

FIG. 1(*b*) is a perspective view of a two-terminal switching device formed in accordance with one exemplary embodiment of the present invention;

FIG. 1(*c*) is a schematic diagram illustrating characteristic curves for a portion of a switching device such as shown in FIG. 1(*b*) in a sample application, illustrating resistance with varying ambient temperature;

FIG. 1(*d*) is a schematic diagram illustrating multiple sets of characteristic curves for a portion of a switching device such as shown in FIG. 1(*b*) implemented for a sample application in a Hall bar configuration, illustrating resistivity with varying ambient temperature under different operating conditions;

FIG. 2(*b*) is a schematic diagram illustrating multiple sets of characteristic curves for a portion of a switching device such as shown in FIG. 1(*b*) in a sample application, illustrating scaled resistivity with varying current density for different device geometries;

FIG. 2(*c*) is a schematic diagram illustrating multiple sets of characteristic curves for a portion of a switching device such as shown in FIG. 1(*b*) in a sample application, illustrating scaled resistivity with varying current density for different device geometries;

FIG. 2(*d*) is a schematic diagram illustrating multiple characteristic curves for a portion of a switching device such as shown in FIG. 1(*b*) in a sample application, illustrating power dissipation with varying ambient temperature for different device geometries;

FIG. 3(*b*) is a schematic plan view of a two-terminal switching device formed in accordance with an exemplary embodiment of the present invention, marked with regions for analytical surface mapping;

FIG. 3(*c*) is a set of schematic diagrams illustrating surfacing mapping results for certain regions of the switching device such as shown in FIG. 3(*b*) in a sample application;

FIG. 4(*b*) is a schematic diagram illustrating multiple sets of characteristic curves for a portion of a switching device such as shown in FIG. 1(*b*) in a sample application, illustrating scaled resistance with varying current density under pulsed actuation having different peak voltage values;

FIG. 5(*b*) is a schematic diagram illustrating multiple sets of characteristic curves for a portion of a switching device such as shown in FIG. 1(*b*) implemented for a sample application, illustrating resistance and voltage responses to the pulsed actuation illustrated in FIG. 5(*a*) over varying time;

FIG. 5(*c*) is a schematic diagram illustrating multiple sets of characteristic curves for a portion of a switching device such as shown in FIG. 1(*b*) implemented for a sample application, illustrating sample switching speed for switching from OFF to ON electrical states;

FIG. 5(*d*) is a schematic diagram illustrating multiple sets of characteristic curves for a portion of a switching device such as shown in FIG. 1(*b*) implemented for a sample application, illustrating voltage and current switching parameters used to compute device power consumption;

FIG. 6(*b*) is a schematic diagram illustrating MPT wire portion resistance results as a function of substrate temperature at different current densities for a sample application of a switching device such as shown in FIG. 1(*b*) in a computer simulated application;

FIG. 6(*c*) is a schematic diagram illustrating MPT wire portion resistance results as a function of applied current density for a 1-µm-wide wire portion of different lengths for a sample application of a switching device such as shown in FIG. 1(*b*) in a computer simulated application;

FIG. 6(*d*) is a schematic diagram illustrating MPT wire portion resistance results as a function of applied current density for a 100 µm long wire portion of different widths for a sample application of a switching device such as shown in FIG. 1(*b*) in a computer simulated application;

FIG. 7(*b*) is a schematic diagram illustrating position-dependent temperature profiles at a certain substrate temperatures and different current amplitudes for a sample application of a switching device such as shown in FIG. 1(*b*) in a computer simulated application;

FIG. 7(*c*) is a schematic diagram illustrating first derivative of resistance with respect to temperature for the sample application shown in FIG. 6(*b*) of a switching device such as shown in FIG. 1(*b*) in a computer simulated application;

FIG. 8(*b*) is a schematic diagram illustrating various simulated voltage pulse profiles to actuate transient modeling results for a sample application of a switching device such as shown in FIG. 1(*b*) in a computer simulated application;

FIG. 8(*c*) is a schematic diagram illustrating certain compiled parameter values demonstrating AFM-FM magnetic transition dynamics in transient response to pulsed voltage stimulation in a sample application of a switching device such as shown in FIG. 1(*b*) in a computer simulated application;

FIG. 8(*d*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*e*) is a schematic diagram corresponding to FIG. 8(*d*) illustrating transient temperature response of the MPT portion to the different pulsed voltage stimulation amplitudes and substrate temperature shown in FIG. 8(*d*), in a sample application of a switching device such as shown in FIG. 1(*b*) in a computer simulated application;

FIG. 8(*f*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*g*) is a schematic diagram corresponding to FIG. 8(*f*) illustrating transient temperature response of the MPT portion to the different pulsed voltage stimulation amplitudes and substrate temperature shown in FIG. 8(*f*), in a sample application of a switching device such as shown in FIG. 1(*b*) in a computer simulated application;

FIG. 8(*h*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*i*) is a schematic diagram corresponding to FIG. 8(*h*) illustrating transient temperature response of the MPT portion to the different pulsed voltage stimulation amplitudes and substrate temperature shown in FIG. 8(*h*), in a sample application of a switching device such as shown in FIG. 1(*b*) in a computer simulated application;

FIG. 8(*j*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*k*) is a schematic diagram corresponding to FIG. 8(*j*) illustrating transient temperature response of the MPT portion to the different pulsed voltage stimulation amplitudes and substrate temperature shown in FIG. 8(*j*), in a sample application of a switching device such as shown in FIG. 1(*b*) in a computer simulated application;

FIG. 8(*l*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*m*) is a schematic diagram corresponding to FIG. 8(*l*) illustrating transient temperature response of the MPT portion to the different pulsed voltage stimulation amplitudes and substrate temperature shown in FIG. 8(*l*), in a sample application of a switching device such as shown in FIG. 1(*b*) in a computer simulated application;

FIG. 8(*n*) is a schematic diagram illustrating transient resistance responsive to different pulsed voltage stimulation amplitudes at a certain substrate temperature in a sample application of a switching device such as shown in FIG. 1(*b*) in a computer simulated application;

FIG. 8(*o*) is a schematic diagram corresponding to FIG. 8(*n*) illustrating transient temperature response of the MPT portion to the different pulsed voltage stimulation amplitudes and substrate temperature shown in FIG. 8(*n*), in a sample application of a switching device such as shown in FIG. 1(*b*) in a computer simulated application;

DETAILED DESCRIPTION OF THE PREFERRED EMBODIMENTS

Figure 1A:
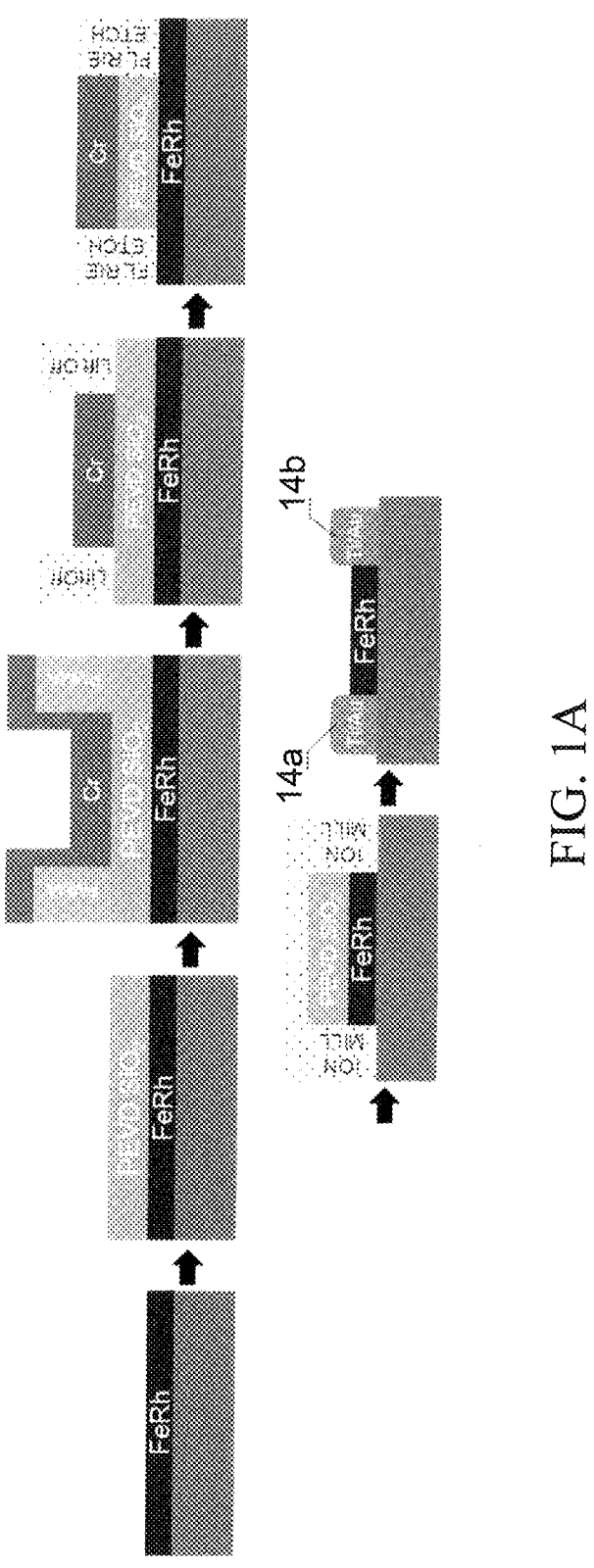
FIG. 1A is a schematic diagram illustrating the flow of processes for fabricating a device formed in accordance with one exemplary embodiment of the present invention.

While the present invention may be embodied in various forms suitable for particular applications, there are shown in the accompanying drawings and described in illustrative detail herein specific embodiments which exemplify the principles of the invention as implemented for certain illustrative applications. It is to be understood that this collective disclosure is meant to be illustrative and exemplary, and is not intended to limit the invention to what is illustrated and described herein.

In accordance with certain aspects of the present invention, and depending on the particular requirements of the intended application, a high speed resistive switching device is formed with a suitable metamagnetic phase transitioning (MPT) portion. The MPT portion is formed substantially of a metallic material which defines a conductive path between two terminals which may be switched in resistivity. In accordance with certain exemplary embodiments, the MPT portion preferably includes such metallic materials as FeRh to implement fast, lithographically simple phase-change devices which may be utilized as memory elements, among other things. The switching is based on the material's transition between different magnetic phases (or the domains or magnetic states relating thereto). In the embodiments and applications illustratively disclosed herein, for example, switching occurs as a result of the MPT portion's transition between well-defined magnetic phases, such as between the antiferromagnetic (AFM) and ferromagnetic (FM) phases. The volumetric expansion/contraction in CsCl-type crystal lattice which characteristically accompany such magnetic phases lead to significant changes in resistivity.

Briefly, the subject switching device provides for high speed metamagnetic resistive switching, preferably in the form of a two terminal switching device of lithographically simple geometry. The subject device includes an MPT portion formed on a given substrate to define a conduction path (or channel) adjustable in resistivity between first and second terminals preferably also formed on the substrate. The device provides for fast and clearly distinctive switching between predetermined ON and OFF states where the MPT portion is unambiguously disposed at alternative resistivity levels.

The device's MPT portion is formed of one of more metallic materials, such as FeRh in the embodiment shown, which may be selectively tuned for temperature-responsive bidirectional transitions in magnetic phases. In the embodiment shown, for example, the transitions occur between AFM and FM phases which are separated by an intermediate/transition phase. The AFM and intermediate phases are delineated by one phase boundary, while the intermediate phase and FM phases are delineated by another phase boundary, as illustrated in the views of various characteristic curves shown in certain of the FIGS. herein.

The MPT portion is formed of one or more metallic materials known in the art which also exhibit hysteresis in magnetic phase response to thermal changes. Accordingly, as the MPT portion is raised in temperature, it transitions in magnetic phase according to a forward characteristic curve of certain profile-progressing, for instance, from the AFM phase, through the intermediate phase, then into the FM phase. But as it is lowered in temperature, the MPT portion transitions in magnetic phase in the reverse direction according to a reverse characteristic curve-returning, for instance, from the FM phase, through the intermediate phase, then back into the AFM phase—that at least partially deviates from the forward characteristic curve. So at each of the noted boundaries, there are different critical temperatures ($T_{Cr}$) for crossing the same boundary between phases, depending on the direction of thermal change (forward/heating direction or reverse/cooling direction in the various FIGS. herein). The different critical temperatures for each boundary is mutually offset from one another by a hysteretic shift characteristic of the MPT portion material(s).

The material(s) forming the MPT portion in the subject switching device undergoes predictable resistivity change when it transitions in magnetic phase. Consequently, when the MPT portion is transitioned between different magnetic phases in response to suitable thermal actuation, the resistance across its conduction path that is adjusted between corresponding values. Electrical ON/OFF states for the conduction path may then be set based on the resistance levels resulting from the magnetic phase transitions.

In accordance with certain aspects of the present invention, the switching device is switched responsive to sufficient pulsed actuation to boost the MPT portion across a magnetic phase transition boundary. Depending on the which direction the MPT portion had last settled into the intermediate/metamagnetic transition phase, the MPT portion may be—in effect—hysteretically shunted across a phase boundary to either the AFM or FM magnetic phase therefrom, for switching its electrical conduction path from one OFF/ON state to the other (in response to thermal actuation pulsed in a suitable direction). In the disclosed embodiment, for instance, the MPT portion is energized by applying a pulsed voltage across the device's terminals. This increases the current density in the MPT portion and generates Joule (or resistive, $P=I\times R^2$) heating of the MPT portion, which raises the temperature of that MPT portion up to at least the higher of the critical temperatures at the phase boundary between the intermediate and FM phases. The accompanying reduction in resistivity (with FeRh) of the MPT portion causes the device to switch ON. The MPT portion may be likewise driven between the intermediate and AFM phases to switch from the ON state to the OFF state responsive to thermal actuation that is pulsed in an opposite direction. For example, the MPT portion is energized by applying a negatively pulsed voltage across the device's terminals. This reduces the current density in the MPT portion which in effect leads to lowering its temperature down to at least the lower of the critical temperatures at the phase boundary between the FM and intermediate phases.

Notably, the critical temperatures at which the AFM-FM transitions occur for FeRh should remain near room temperature in most applications, and may be suitably tuned using such variable features as substitutional doping, strain, and/or patterning. In the embodiment shown, the MPT portion is preferably formed with a simple geometric structure, effectively as a metallic wire dimensioned to suit the requirement of the intended application. The temperature-dependence of the transitions makes device manipulation through Joule heating possible in many applications-avoiding undue risk of altering circuit operation or harming its components. Accordingly, electric current flowing through the FeRh wire in the disclosed embodiment may be controlled to heat the wire above its $T_{Cr}$, inducing an AFM-FM transition in phase. This transition is known to be quite rapid for FeRh, potentially occurring over a time period of about 500 fs or less, and potentially leading to a new class of metallic PCM devices operating at THz frequencies well suited to neuromorphic computing applications.

The subject device with its fast and stable switching capability between states is well suited for use as memory elements. It is capable of functioning much like memristive elements known in the art. As noted, the subject metamagnetic memristive-like switching device is preferably formed as a two-terminal devices having an MPT portion formed by FeRh wire extending between two metal contacts. Geometrical dependencies of the switching characteristics indicate that the AFM-FM transition temperature scales with both current density and wire length of the FeRh wire. Pulsed I-V measurements demonstrate the operating conditions memory elements employing these memristive-like switching devices would be subjected to in computing applications. These measurements show the dynamic Joule heating effects, including the device switching speed and resulting power switching capabilities accompanying the AFM-FM transition. Switching speeds of the device exceeded the physical limits of sensitivity for the available equipment, namely 300 ns. Actual switching speeds of the device in the disclosed embodiment were thus confirmed to be at least 300 ns, but understood to be considerably faster.

While FeRh is preferably employed in the illustrated embodiment, due largely to its metamagnetic transition remaining above but near room temperature in most applications, other metallic materials of suitable properties and metamagnetic transition characteristics may be employed in certain alternate embodiments. The magnetic transition FeRh has direct impact on the electrical transport properties of the material, as noted in preceding paragraphs. For FeRh in the AFM phase, the magnetic moments of adjacent Fe atoms are aligned antiparallel while Rh are without any net magnetic moment. In the FM phase the Fe magnetic moments are aligned in parallel while Rh takes on a magnetic moment that is aligned in parallel with the Fe magnetic moment. The antiparallel alignment of magnetic moments induces scattering of electrons with both spin states (scattering is maximized for electrons in like-spin states), leading to increased resistance. In the FM phase, electrons with spin parallel to the magnetic moment of the atoms are scattered at a greater rate, yet electrons with opposite spin polarity have significantly reduced scattering, the net effect being a reduction in resistance by over 50%.

Fabrication Example

With reference to FIG. 1A, a metamagnetic resistive switching device in one exemplary embodiment is formed for use in a manner similar to memristor logic devices. In this embodiment, the device is formed preferably with one or more FeRh films grown on MgO substrates by sputter deposition with thicknesses of 35 and 200 nm. A 500 nm $SiO_2$ layer is deposited using plasma-enhanced chemical vapor deposition (PECVD) as a hard mask for FeRh ion milling. Suitable photolithography is used to define 10×100 μm Hall bars and wires of varying widths and lengths. Electron beam lithography (EBL) is used to define the wire geometry in poly-methyl methacrylate (PMMA) followed by metal deposition of a 20 nm Cr hard mask on the $SiO_2$ surface. The $SiO_2$ layer is then etched by inductively coupled plasma (ICP) reactive ion etching (RIE) with 10 sccm $CHF_3$ and 15 sccm Ar under a chamber pressure of 30 mTorr, 30 W RF power, and 600 W ICP power, defining a hard mask for the ion milling process. The Cr mask is removed by the ion milling process, and any remaining $SiO_2$ layer over the FeRh wires is removed by a second ICP/RIE step. Finally, EBL is used to define bond-pads in PMMA followed by electron beam evaporation of Ti/Au (10/50 nm) and metal lift-off in acetone.

With more specific reference to FIG. 1A, the flow of fabrication processes in this example occurs as follows.

I. FeRh films are deposited by magnetron sputter on various substrate chosen to tune the FeRh phase transitional characteristics which is previously shown in literature (i.e. MgO, Sapphire, N-type or P-type Silicon). Buffer layers may also be selected accordingly to tune the FeRh's phase transitional properties using substrate strain (i.e. W, Pt, Pd, Ru). Electric field can also be used to tune the substrate strain using a piezoelectric substrate (i.e. $BaTiO_3$).

II. A PECVD grown $SiO_2$ layer is deposited on top of the $SiO_2$ to be used as a hardmask III. Either EBL or Photolithography is used to pattern spin coated PMMA/photoresist on top of the $SiO_2$ hardmask (EBL for smaller wire diameters).

IV. Cr is deposited by electron beam deposition.

V. PMMA/photoresist is dissolved via liftoff.

VI. ICP/RIE is used to etch through the PECVD $SiO_2$ hardmask.

VII. High energy Ar ion milling is used to pattern the FeRh through the Cr/PECVD $SiO_2$ hardmask.

VIII. ICP/RIE is used to strip the remaining $SiO_2$ hardmask.

IX. Either EBL or Photolithography is used to pattern bond pads from spin coated PMMA/photoresist on top of the FeRh wires via liftoff.

X. Ti/Au electrodes are deposited by E-beam vapor deposition followed by a subsequent chemical liftoff in a resist stripper solution.

Figures 1A, 1B, 1D, 1E:
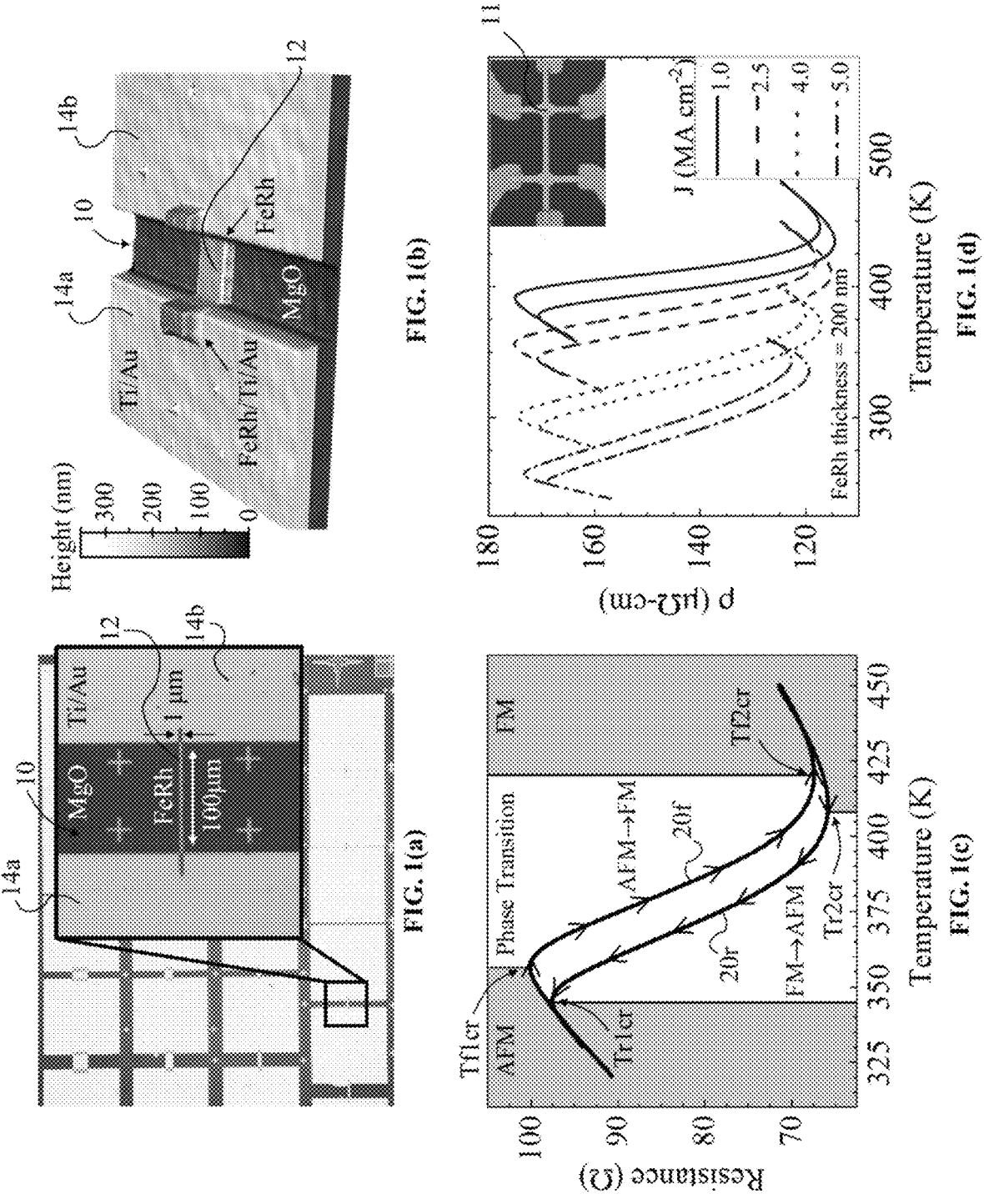

Referring now to FIGS. 1(a)-1(d), FIG. 1(a) illustrates a top view optical images of fabricated two-terminal FeRh devices 10 with 35-nm-thick wire portions having widths and lengths varying from 0.3 to 50 μm and 2.5 to 100 μm, respectively. The enlarged portion of the image shows a device formed with an FeRh wire portion having width, height, and thickness of 1 μm, 100 μm, and 35 nm, respectively. FIG. 1(b) illustrates a perspective view optical image of a device 10 showing topology. FIG. 1(c) schematically illustrates characteristic curves for FeRh wire resistance while varying the ambient temperature from 320 K to 450 K. Curves 20f, 20r represent forward/heating and reverse/cooling cycles, respectively. Background shaded regions denote temperature regimes at which the FeRh is disposed in AFM, FM, and intermediate transitional phases. FIG. 1(d) illustrates multiple sets of characteristic curves for FeRh Hall bar resistivity as a function of ambient temperature under different operating conditions (different current densities through the device). The inset view shows an image of the FeRh Hall bar with FeRh layer thickness of 200 nm.

FIGS. 1(a) and 1(b) show examples of switching devices 10 as fabricated in accordance with one exemplary embodiment of the present invention having FeRh wires forming MPT portions 12 coupled between terminals/electrodes 14a, 14b of Ti/Au material are shown. The FeRh material's crystalline quality was evaluated using X-ray diffraction and high-resolution transmission electron microscopy in view of properties of representative FeRh films known to those of skill in the art. Sample resistance measurements illustratively disclosed herein were made in a closed-cycle cryogenic probe station environment using a parameter analyzer. All measurement data was gathered while the sample was under a vacuum of $<1 \times 10^{-4}$ Torr.

As shown, the MPT portion 12 of the switching device 10 in this embodiment is formed to include a film of FeRh material processed into devices having Hall bar and two-terminal wire configurations of various suitable dimensions. Representative two-terminal wire devices 10 are shown in FIG. 1(a), with an enlarged view illustrating one of the various devices 10 to be formed, having for example a wire thickness of 35 nm, width 1 μm, and length of 100 μm. FIG. 1(b) shows a three-dimensional optical image of a two-terminal wire device 10 incorporating FeRh material, as measured using a confocal laser microscope. FIG. 1(c) is a graphic view schematically illustrating a characteristic response of another device (in a Hall bar configuration) incorporating in its MPT portion FeRh film having a thickness of 200 nm. The curves 20f, 20r shown plot resistance as a function of ambient temperature while a constant current of 25 mA (2.5 MA cm−2) is applied through the device. Differently shaded regions in the graphic views denote the different temperature-based magnetic phases at which the FeRh material may be disposed depending on operating conditions, namely: the AFM phase, the FM phase, or the transitional intermediate phase therebetween. As shown by the forward/heating curve 20f, as the device is heated its MPT portion formed by FeRh material begins to transition in magnetic phase from AFM to FM, once the temperature exceeds a forward critical temperature $Tf1_{C_r}$ at the first phase boundary of about 355 K in the illustrated case. The AFM-FM phase transition is accompanied by a decreasing resistance and continues until the temperature reaches a forward critical temperature $Tf2_{C_r}$ at the second phase boundary of about 420 K in this case, whence the FeRh material is fully transitioned into the FM phase.

A similar but opposite effect occurs when the device is cooled back down. As shown by the reverse/cooling curve 20r, as the device is cooled the FeRh material begins to transition in magnetic phase from FM back to AFM, once the temperature dips below a reverse critical temperature $Tr2_{C_r}$ at the second boundary (at about 410 K in the illustrated case). The FM-AFM phase transition is accompanied by an increasing resistance and continues until the temperature returns to a reverse critical temperature $Tr1_{C_r}$ at the first phase boundary of about 345 K in this case, whence the FeRh material is fully transitioned back into the AFM phase.

The two curves 20f, 20r demonstrate the hysteretic behavior of the MPT portion of the subject device, as they do not remain coincident with one another. Bidirectional phase transitions of the MPT portion between AFM and FM phases responsive to changes in ambient temperature thus occur at different critical temperatures which are mutually offset by a hysteretic shift. That is, a hysteresis effect occurs characteristically between the MPT portion's forward and reverse transitions in magnetic phase. So at the respective phase boundaries 2 and 1, the critical temperatures $Tr2_{C_r}$, $Tr1_{C_r}$ between which the MPT portion transitions in magnetic phase in the reverse direction are offset by hysteretic shifts from counterpart critical temperatures $Tf2_{C_r}$, $Tf1_{C_r}$ between which the MPT portion transitions in magnetic phase in the forward direction.

The AFM→FM transition of the MPT portion in the illustrated embodiment is taken to be in the forward direction (for convenience of reference only), such as when it undergoes sufficient heating. The FM→AFM transition is conversely taken to be in the reverse direction (for convenience of reference only), such as when it undergoes sufficient cooling. One skilled in the art will recognize that such forward and reverse directional references are inherently relative, and arbitrarily chosen herein to distinguish between two phase transition curves graphically exhibiting hysteretic behavior. They could just as well be assigned in reverse for explanatory purposes, depending on the illustrated orientation of the AFM/FM phase transitions.

In FIG. 1(d), the resistivity ($\rho$xx) of a 200-nm-thick FeRh Hall bar 11 (inset) is represented as a function of temperature for current densities in the FeRh Hall bar ranging from J=1 MA cm$^{-2}$ to 5 MA cm$^{-2}$ (10 mA to 50 mA, respectively), measured while sweeping the sample temperature at a rate of ±1 K min$^{-1}$. The AFM-FM transition, as evidenced by the abrupt change in resistivity, is observed for each applied current density regardless of ambient temperature, but shifts from 410 K at 1 MA cm$^{-2}$ to 255 K at 5 MA cm$^{-2}$. The decrease in transition temperature is accompanied by a widening of the transition range.

Figures 2A, 2B, 2C, 2D:
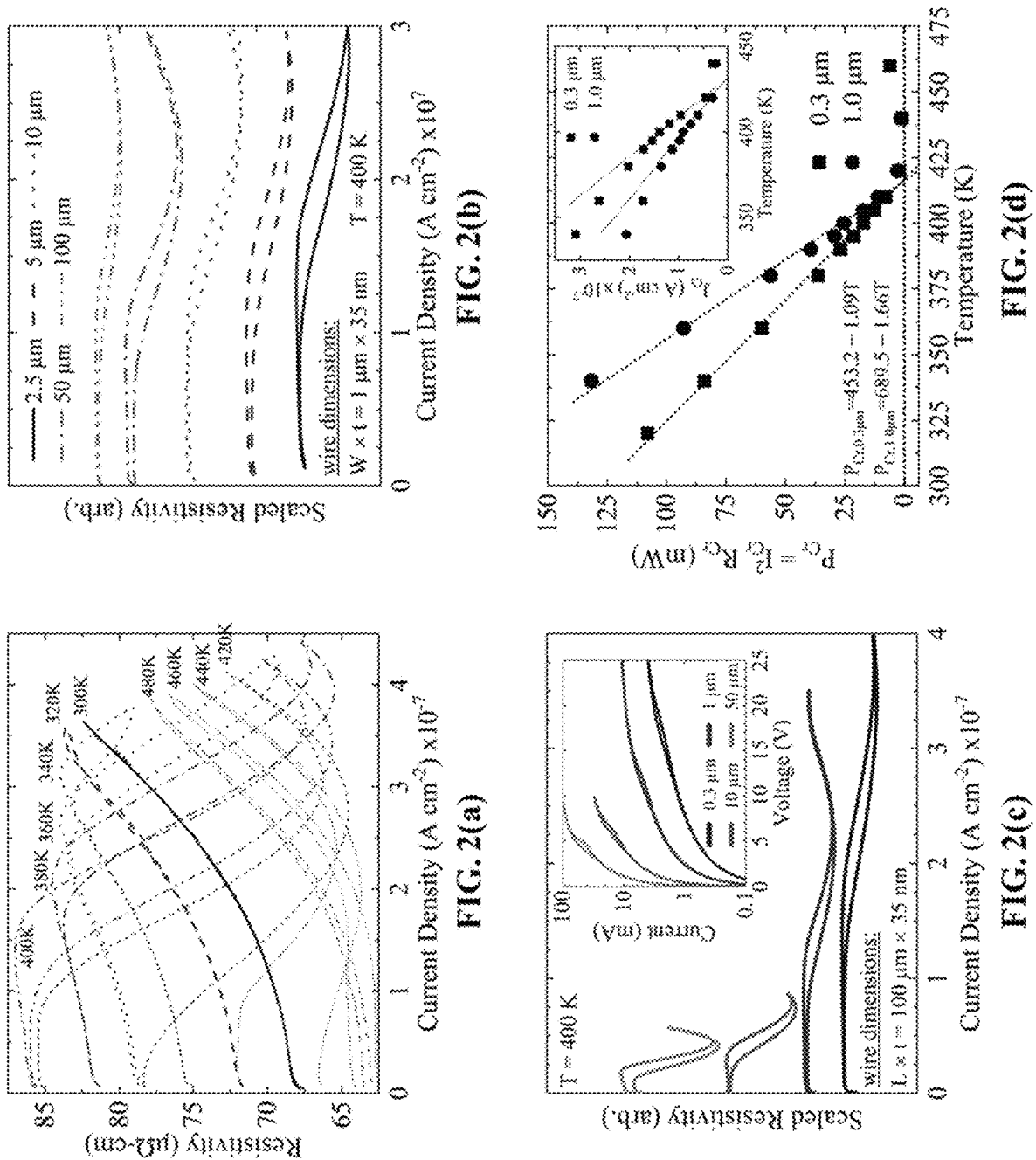
FIG. 2(*a*) is a schematic diagram illustrating multiple sets of characteristic curves for a portion of a switching device such as shown in FIG. 1(*b*) in a sample application, illustrating resistivity with varying current density under different operating conditions.

FIGS. 2(a)-2(d) illustrate the temperature and geometrical dependencies resulting from FeRh magnetic phase transition analysis by DC transport characterization. FIG. 2(a) schematically illustrates FeRh resistivity as a function of current density for different ambient temperatures ranging from 300 K to 480 K. The sample data shown were obtained a device having FeRh wire width, length, and thickness dimensions of 0.3 μm, 100 μm, and 35 nm, respectively. The critical current density, $J_{Cr}$, decreases significantly as the ambient temperature is increased. Resistivity may be measured as a function of current density for a series of wires with varying lengths and widths, as illustrated respectively in FIGS. 2(b) and 2(c). The wire-length-dependent $\rho$-J measurements were made for a 1-μm-wide wire, while the wire-width-dependent $\rho$-J measurements were made for a 100-μm-long wire. The inset view of FIG. 2(c) shows the measured I-V characteristic for the wires of varying width. FIG. 2(d) illustrates critical power dissipation as a function of ambient temperature for 100-μm-long wires having widths of 0.3 μm (square points) and 1 μm (circular points). The inset view of FIG. 2(d) shows the critical current densities for the same two wires. The occurrence of Joule heating was confirmed by curve-fitting the Per-T data, during which an identical $T_{Cr}$ of 415 K was extracted from the two wires with different geometries.

With the dependence of the AFM-FM transition characteristic on the current in the MPT portion thus established, reference is now made to the transition at fixed temperatures while sweeping current in the MPT portion. FIG. 2(a) shows the wire resistivity as a function of current density at different ambient temperatures ranging from 300 K to 480 K for a 0.3×100 μm wire with thickness of 35 nm. At 300 K the FeRh wire remains in the AFM phase through the full sweep of current density, as the induced Joule heating is insufficient to elevate the wire temperature to $T_{Cr}$. At 320 K the AFM-FM transition begins at a high current density of ~3.3×10$^7$ A cm$^{-2}$. At 340-360 K a larger region of the AFM-FM transition results, but the current density is insufficient to force a full FM transition. At 380-400 K the wire fully transitions into the FM phase, then when the current density is decreased the FM-AFM transition begins as the wire is cooled. At 420-440 K the wire begins in the AFM phase, then transitions into the FM phase with an increasing current density. However, the high ambient temperature prevents the FeRh from transitioning back into the AFM phase when reducing the current density to zero. At 460-480 K the wire begins in the FM phase, as the AFM-FM transition was fully driven by ambient temperature.

The shift in transition temperature, measured as the maximum of the $\rho$-J curve where $\rho$ begins to decrease, is shown in the inset view of FIG. 2(d). Joule heating depends on applied power and is directly proportional to the square of the current. Therefore, the reduced current density required for the AFM-FM phase transition at higher temperatures provides a clear indication of Joule heating. At an ambient temperature within the transition width (intermediate phase), the current-induced Joule heating partially transitions the FeRh, then returns to a lower resistance as the current is reduced.

Turning to wire geometry dependencies of thermal dissipation effects, sample measurements were taken at 400 K. FIG. 2(b) shows the $\rho$-J curves for 1 μm wide FeRh wires with lengths ranging from 2.5 μm to 100 μm and thickness of 35 nm. The resistivity scale for each curve is offset for clarity. The current density through a wire does not scale as a function of wire length. Nonetheless, the AFM-FM transition temperature tends to be reduced for longer wires. Applying a constant current density through wires of increasing length requires a larger applied bias. Regardless of the associated thermal profile, longer wires dissipate more power which causes the substrate temperature to increase.

Similarly, as shown in the $\rho$-J curves of FIG. 2(c), the wire width also affects AFM-FM transition temperature. The sample data shown here were measured using 100 μm long FeRh wires having widths ranging from 0.3 μm to 50 μm. The curves are offset for clarity. As shown, the larger wires cannot cool as quickly due to a larger FeRh/substrate interfacial area yielding greater substrate heating contribution and lessened heat dissipation into the metal contacts and surrounding ambient environment. The 100 μm length was chosen because many of the shorter wires do not fully transition through the hysteresis region within the given current density range.

FIG. 2(d) shows the critical power dissipation, $P_{Cr}$, and critical current density, $J_{Cr}$ (inset), as a function of temperature for two 100 μm long FeRh wires having widths of 0.3 μm (square points) and 1.0 μm (circular points). As shown in the inset view, $J_{Cr}$ does not decrease linearly with increasing temperature. However, a substantially linear dependence is observed when plotting $P_{Cr}$ vs. temperature. The critical power dissipation may be computed using Equation (1), which is expressed in terms of critical current ($I_{Cr}$) and critical resistance ($R_{Cr}$) at which the FeRh AFM-FM transition begins.

$$P_{Cr} = I_{Cr}^2 R_{Cr} \overset{\Delta}{=} \alpha \Delta T \tag{1}$$

Once the FeRh wire has reached thermal equilibrium, $P_{Cr}=\alpha\Delta T$, where $\alpha$ [WK$^{-1}$] represents heat dissipation from the FeRh wire and $\Delta T$ represents the temperature increase caused by Joule heating. The linear dependence of $P_{Cr}$ on T indicates that the AFM-FM phase transition is directly caused by Joule heating. Notably, an identical $T_{Cr}$ of 415 K is observed for the wires of both dimensions when extrapolating $P_{Cr}$ to the x-axis. The slope of the two $P_{Cr}$ curves vary because of $\alpha$, which is found to be −1.09 WK$^{-1}$ and −1.66 WK$^{-1}$ for wire widths of 0.3 μm and 1 μm, respectively. The increase of a amplitude for the larger wire width results as a function of the FeRh/metal interfacial area.

Above and below the metamagnetic transition, the electrical transport properties follow that of typical metals known in the art, where increased phonon scattering degrades conductance, leading to a positive temperature coefficient of resistance. Moreover, the temperature coefficient of resistance is approximately equal in magnitude in both the AFM and FM states. The absolute value of the resistivity, not its temperature dependence, differs. Near the metamagnetic transition temperature, microscopic domains of FeRh in the AFM state begin to transition into the FM state, simultaneously changing the overall resistance of the conductor. The precise temperature at which each domain changes is driven by defects, strain, the state of neighboring domains, etc., creating a distribution of temperatures over which the full transition occurs.

For a single domain, therefore, the change in resistance with temperature tends to appear abrupt and square-like, while the distribution of transition temperatures in a multi-domain wire tends to induce a gradual change. The origin of these thermal mechanisms, as well as the observed Joule heating behavior, are elucidated via finite element simulations. Heat transfer physics were modeled using temperature-dependent thermodynamic ($C_p$, $\kappa$, , density) and electrical properties.

Figures 6A, 6B, 6C, 6D:
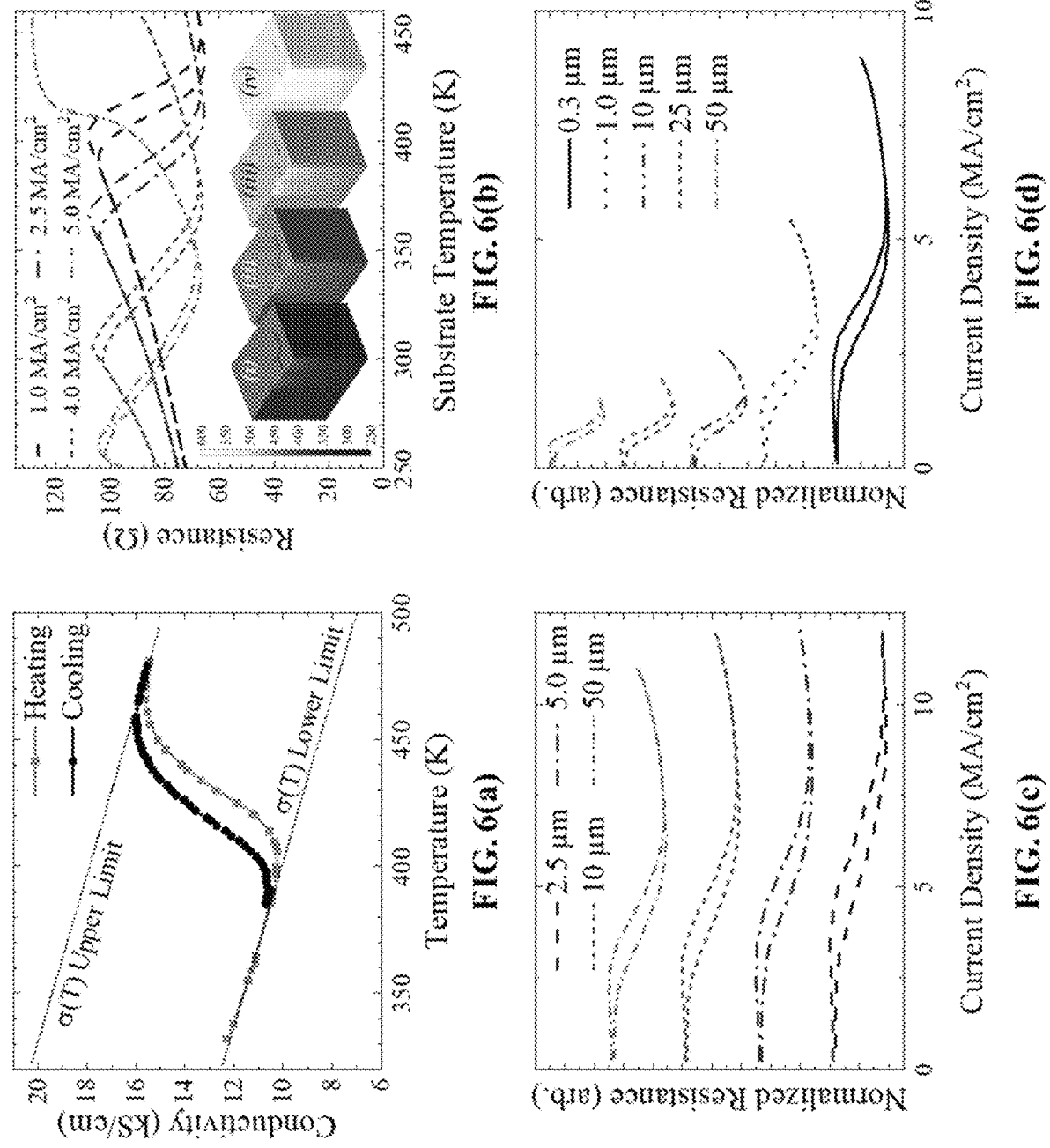
FIG. 6(*a*) is a schematic diagram illustrating certain temperature-dependent conductivity functions for modeling heat transfer physics for a sample application of a switching device such as shown in FIG. 1(*b*) in a computer simulated application.

The disclosed embodiment exhibits a hysteresis of approximately 10-15 K for typical applications, along with a reduction in the onset of transition temperature with DC bias. The embodiment also exhibits and an increase in the transition width with DC bias, as reflected in the variously measured results. Simulated wire length and width dependencies (such as shown in FIGS. 6(c), 6(d)) were found to be consistent with the experimental data, indicating that ampacity significantly increases for the narrowest wires due to ampacity scaling as a function of wire linear mass density.

Figures 3A, 3B, 3C:
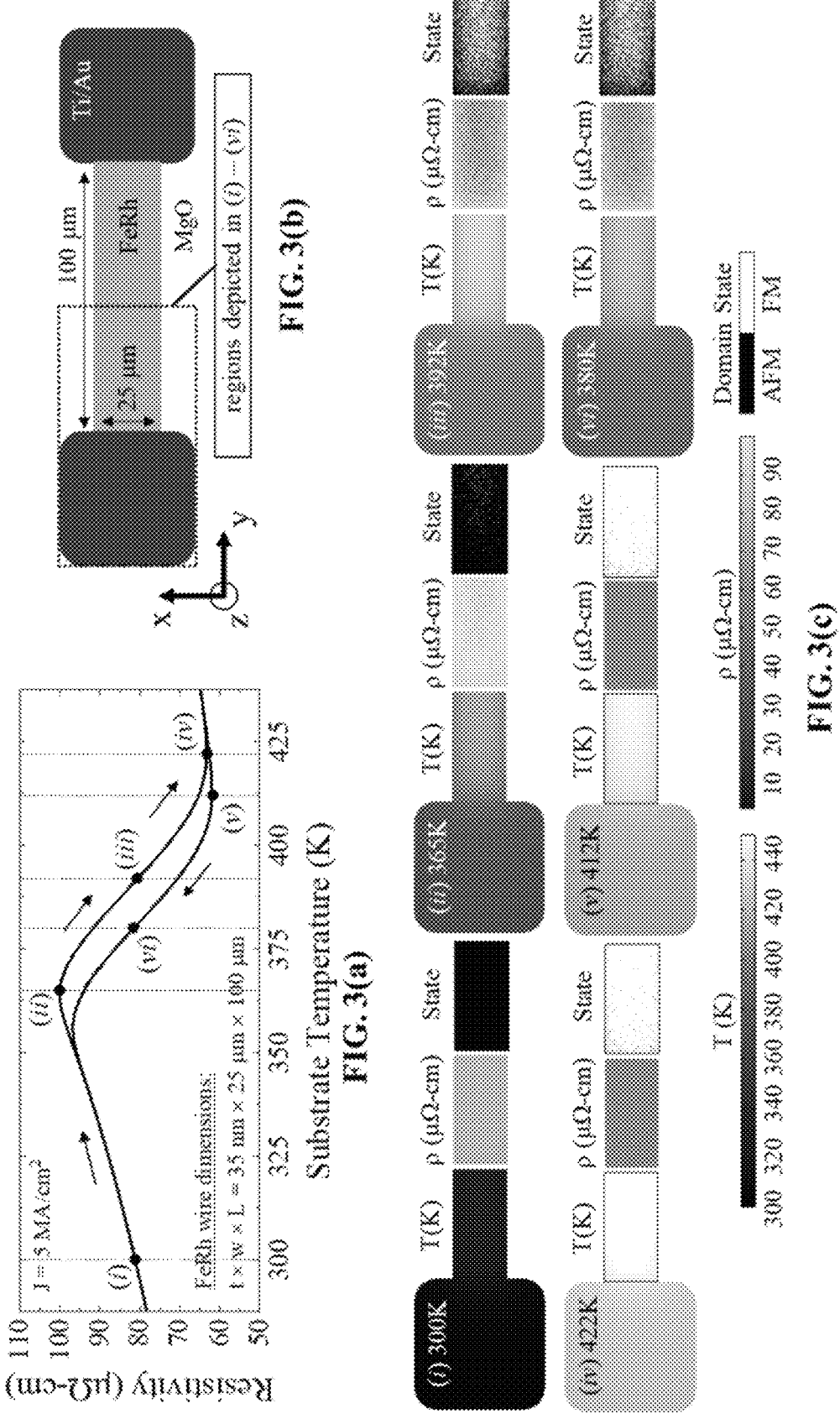
FIG. 3(*a*) is a schematic diagram illustrating characteristic curves for a portion of a switching device such as shown in FIG. 3(*b*) formed on a substrate in a sample application, illustrating resistance with varying substrate temperature.

Referring to FIGS. 3(a)-3(c), FIG. 3(a) illustrates representative resistance vs. temperature sweep results for a current density in the FeRh wire of 5 MA cm$^{-2}$. The points (i)-(vi) indicate the specific temperatures at which the subsequent surface maps of FIG. 3(c) were generated. The surface maps were generated while sweeping the temperature during a heating cycle, as indicated by the data points shown on the curve. FIG. 3(b) shows a schematic diagram of the FeRh wire device including a region marked to indicate the portion of the sample which is depicted in the subsequent surface maps of FIG. 3(c), including half of the FeRh wire length and one metal contact coupled thereto. FIG. 3(c) shows surface maps of the outlined sample area indicating temperature, wire resistivity, and individual FeRh domain states/phases (AFM or FM) for substrate temperatures of (i) 300 K, (ii) 365 K, (iii) 392 K, (iv) 422 K, (v) 412 K, and (vi) 380 K. For (v) and (vi) the substrate is cooled from 500 K, all others are for the heating phase of the heat/cool cycle.

Analysis of certain device parameters during a temperature sweep provides insight into the fundamental origins of the globally measured transport properties. FIG. 3(a) illustrates sample wire resistivity values as a function of substrate temperature for a current density in the MPT portion of 5 MA cm$^{-2}$. FIG. 3(b) shows the device regions corresponding to the points depicted in FIG. 3(c) for each of the points (i)-(vi) noted in FIG. 3(a). The device regions encompass one metal contact and half of the 100-μm-long FeRh wire of the MPT portion. FIG. 3(c) shows surface maps of temperature, resistivity, and state of individually modeled FeRh domains for substrate temperatures of (i) 300 K, (ii) 365 K, (iii) 392 K, (iv) 422 K, (v) 412 K, and (vi) 380 K. Despite a relatively low substrate temperature of 300 K, the wire temperature increases as shown to 334 K near the center. The elevated temperature is an effect of Joule heating, which persists on through to the edge of the contact where heat dissipation is enhanced by the Au electrode.

Once the substrate temperature is raised to (ii) 365 K, the peak wire temperature and terminal resistivity reach 417 K and 100 μΩ-cm, respectively. This temperature corresponds with the peak wire resistance, where temperature-induced increases in resistance are offset by the accumulation of domains which have transitioned to the lower resistivity FM state. These transitioned regions are observed as green domains and white domains in the resistivity and state maps for substrate temperature point (ii), and are most concentrated near the middle of the FeRh wire where the temperature is the highest. This behavior becomes more pronounced as the temperature is increased to (iii) 392 K. The locations of the transitioned regions are random, yet generally located near the middle and away from the metal contact where the wire is at its highest localized temperature. At (iv) 422 K, the wire reaches its minimum resistance state, where the temperature-induced increases in resistance exceed the reduction in resistance from switching domains, since nearly all domains are now in the FM state. The hysteresis in the wire is clearly evidenced on the cooling cycle as nearly all domains remain in the same state at (v) 412 K, and despite having a 12 K cooler substrate at (vi) 380 K resistivity and state maps result which closely resemble those observed upon heating to (iii) 392 K.

Figure 4B:
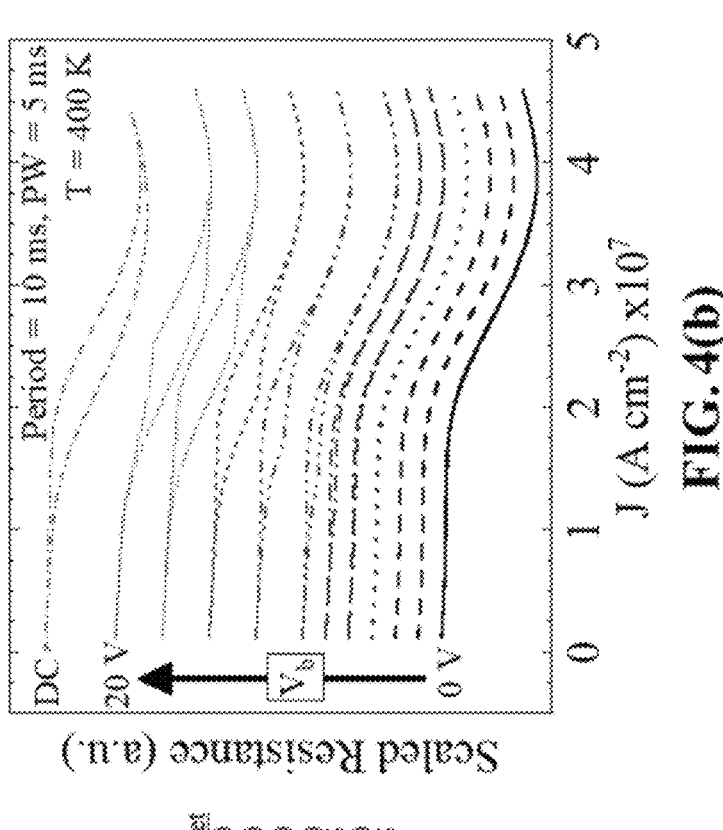
FIG. 4(*a*) is a schematic diagram illustrating multiple sets of characteristic curves for a portion of a switching device such as shown in FIG. 1(*b*) in a sample application, illustrating current density with varying baseline voltage amplitude for pulsed actuation having different peak voltage values.
Figure 4A:
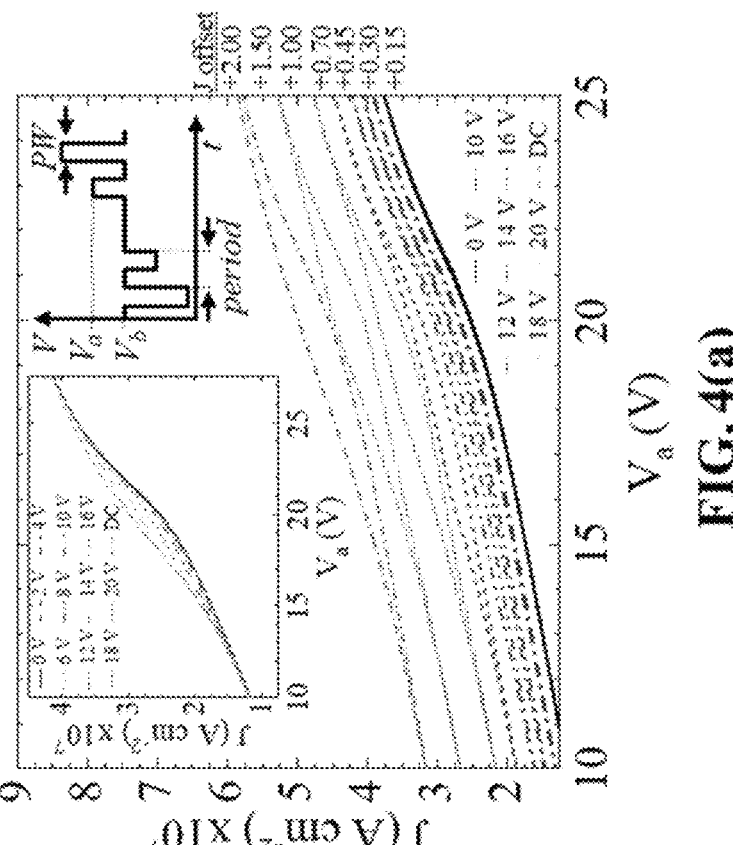

Referring to FIGS. 4(a)-4(b), FIG. 4(a) illustrates a sample FeRh wire portion as characterized by pulsed J-$V_a$ (current density-voltage) curves for operating conditions which are more coherent with switching devices typically used in practice. The data reflects an ambient temperature of 400 K using a FeRh wire having length, width, and thickness dimensions of 100 μm, 0.3 μm, and 35 nm, respectively. FIG. 4(a) J-$V_a$ and FIG. 4(b) R-J curves are shown while varying the base voltage amplitude. Aside from the inset plot of FIG. 4(a), each curve is offset for clarity and both contain a DC measurement for comparison purposes. Data was gathered using bias pulses of 10 ms period and 5 ms pulse width. The inset plot shown in FIG. 4(a) contains the as-measured J-V curves without an offset to show how they collapse onto a single loop. Additionally, a pulse profile schematic containing the pulse width (PW), baseline voltage ($V_b$), and amplitude voltage ($V_a$) is shown in FIG. 4(a).

A pulsed bias enables precise control over self-heating effects and establishes realistic device operation parameters such as switching speeds. Pulsed I-V has been used to analyze thermal effects in a wide variety of materials, including Si, wide bandgap semiconductors such as GaN and $Ga_2O_3$, and phase change materials like $Ge_3Sb_2Te_6$. Pulsed J-V measurements shown in FIG. 4(a) were made at 400 K on an FeRh wire portion having length and width of 100 μm and 0.3 μm, respectively. The pulse profile, shown schematically in FIG. 4(a) includes a 5 ms pulse width (PW), 10 ms period, a pulsed amplitude voltage ($V_a$) varied from 0-30 V and a baseline voltage ($V_b$) varied from 0-20 V. The view shows the J-V curves offset for visual clarity when $V_b$=0 V and when $V_b$=10 V-20 V. A DC measurement is included for comparison purposes. The inset view presents the data without the offset to show how the data collapses onto a single J-V loop. The hysteresis regions of the J-V curves remain fixed along the voltage axis, but widen along the current axis as $V_b$ is increased from 10 V-20 V.

FIG. 4(b) shows the change in resistance with current density (R-J), the curves being offset for clarity. Hysteresis in the R-J characteristic begins to develop once $V_b$>10 V. Although hysteresis remains visible in the DC measurements, the absence of hysteresis for low $V_b$ during pulsed operation indicates that heat is dissipating at a high enough rate to allow the FeRh to cool and transition back into the AFM phase between each pulse. This thermal dissipation effect may be manipulated by increasing the baseline voltage, evident by the evolution of the R-J hysteresis with bias voltage. When using pulses, a persistent FeRh FM state is only achieved when 1) the $V_b$ amplitude is large enough such that the FeRh can exceed Tor in temperature and 2) $V_a \geq V_b$.

Figures 5A, 5B, 5C, 5D:
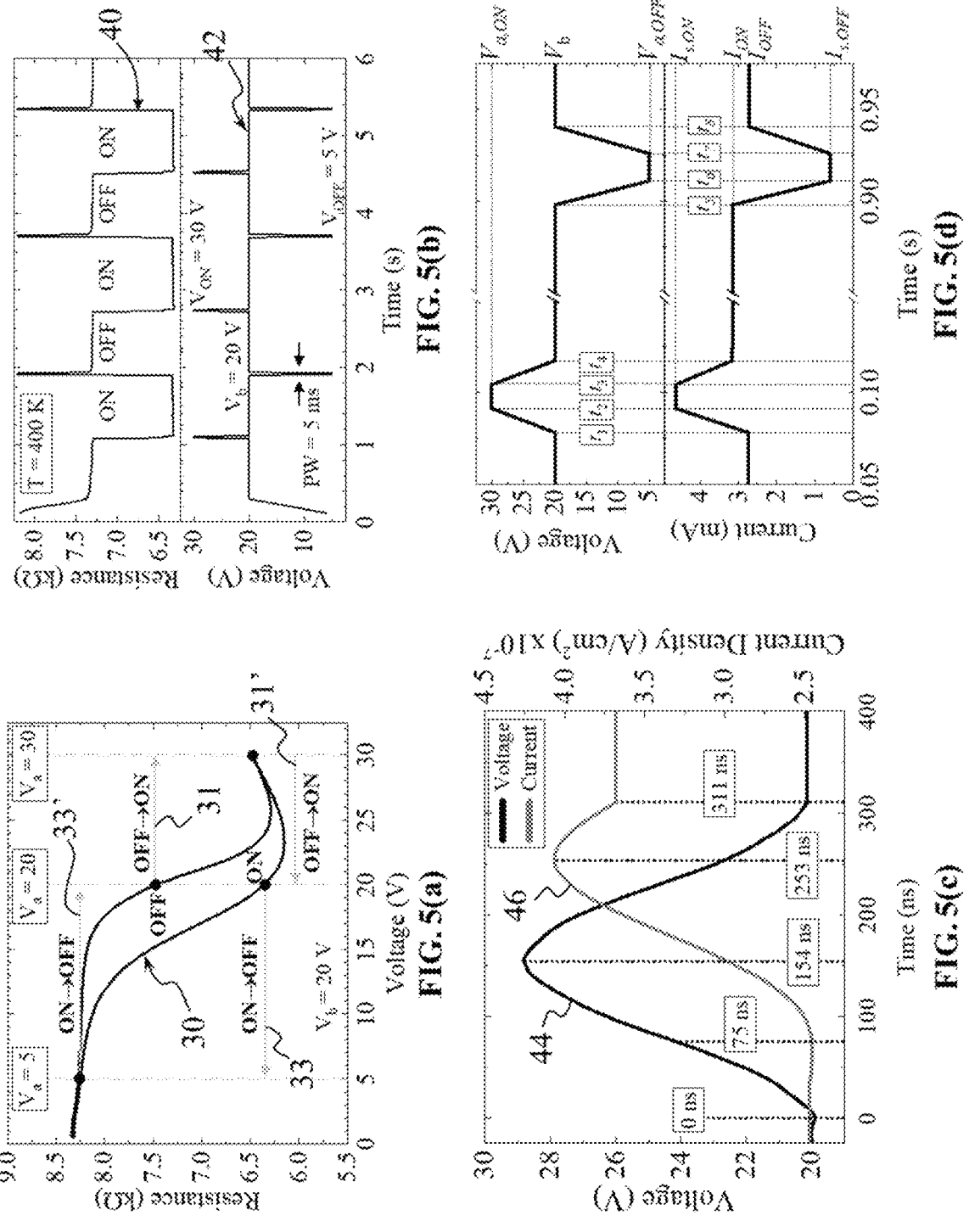
FIG. 5(*a*) is a schematic diagram illustrating characteristic curves for a portion of a switching device such as shown in FIG. 1(*b*) in a sample application, illustrating resistance with varying voltage, illustrating the switching effects of suitably pulsed actuation.

Referring to FIGS. 5(a)-5(d), FIG. 5(a) shows a pulsed operation state-switching schematic diagram that schematically illustrates the pulsed voltage amplitudes required to switch between AFM and FM states in a sample case. At a constant 20 V bias, the switching device incorporating an FeRh MPT portion may be disposed in either of two electrical states. The device remains in a given state assuming it remains thermally stable. Switching between states may be actuated by applying a short, pulsed voltage to peak either at Va=5 V (e.g. FM-AFM transition, ON to OFF) or Va=30 V (e.g. AFM-FM transition, OFF to ON). In FIG. 5(b) this switching capability is shown by the transient resistance of the FeRh MPT portion while pulse biasing the device to switch between ON and OFF states using a baseline voltage V of 20 V and peak switching voltage Va of either 5 V (OFF) or 30 V (ON). FIG. 5(c) illustrates for this particular sample case a high switching speed of 311 ns as observed switching from OFF to ON. The switching speed shown here was limited to the sensitivity limits of the measurement equipment, and represents a 'ceiling' for FeRh MPT portion switching speed capability. FIG. 5(d) shows certain illustrative switching parameters used in the sample case to calculate device power consumption, including Va, N=30 V, Vb=20 V, Va, oFF=5 V, Is, 0N=4.646 mA, ION=3.155 mA, IOFF=2.736 mA, Is, OFF=0.610 mA, t2−tz=13.045 ms, t3−t2=13.014 ms, t4−t3=12.999 ms, t6−ts=13.053 ms, t7−t6=14.753 ms, and ts−t7=14.742 ms.

The pulsed voltage conditions may be fine-tuned for the particular requirements of the intended application of a given embodiment to quickly switch between the AFM and FM states. Such fine-tuning may be carried out, for example, with reference to the DC-IV plot such as shown in FIG. 5(a) for a sample FeRh wire device (width=0.3 μm, length=100 μm). To function as an MPT switching element, the FeRh portion's temperature must be stabilized such that the resistance lies somewhere within the metamagnetic transition region (intermediate phase). For example, this could be achieved by establishing a 20 V DC bias. Rather than applying a constant DC bias, a pulsed bias may applied with a 20 V baseline voltage where the FeRh portion settles to a temperature within the metamagnetic transition region. At this temperature, crystal domains could exist in either an AFM (high resistance) or FM phase (low resistance). The device need not completely switch to a pure AFM or FM phase, it just needs to have a majority of domains in either the AFM or FM phase to produce a sufficient change in resistance.

When Va is set to 20 V, the AFM and FM phases in this sample case yield MPT portion resistances of 7.4 kQ and 6.3 kQ, respectively. This device may be switched ON (AFM-FM transition), for example, by applying a pulsed voltage of Va=30 V then reducing Va back to 20 V to maintain state (as indicated by the arrows 31 and 31'). Likewise, the device may be switched OFF (FM-AFM transition) by applying a pulsed voltage of Va=5 V then increasing Va back to 20 V to maintain state (as indicated by the arrows 33 and 33').

FIG. 5(b) illustrates switching functionality using the methodology reflected by FIG. 5(a). The transient resistance characterized by the curve 40 was measured while applying a pulsed voltage waveform, as characterized by the curve 42. The pulse profile includes a 20 V baseline voltage, and short 5 ms voltage pulses-either downward to peak at 5 V, or upward to peak at 30 V—for switching between ON and OFF states, respectively. As shown, the voltage is ramped from 0 V to 20 V to enter the hysteresis center-region of the R-V curve 30 shown in FIG. 5(a) and held at 20 V for ~1 second, maintaining the AFM state. Att=1.1 s, the voltage is then pulsed to Va=30 V for 5 ms, causing the wire temperature to increase such that the AFM-FM transition occurs and the device is switched ON. After this 5 ms pulse, Va is reduced to 20 V to maintain the FeRh portion at that temperature (to remain in the FM phase) and thereby hold the device in the ON state. Next, at t=1.9 s, the device is switched OFF by applying a 5 ms pulse of Va=5 V, then returning to Va=20 V to maintain the FeRh portion at that temperature (to remain in the AFM phase) and thereby hold the device in the OFF state. This provides fast and unambiguous switching while preserving switching endurance and state retention in the device.

To establish an upper bound on the switching speed, the transient current was measured over individual 150 ns voltage pulses (using instrumentation which allowed for single transient pulses for PW<5 ms rather than a repeating waveform as shown for PW>5 ms). FIG. 5(c) shows the applied transient voltage curve 44 and measured current curve 46 during individual pulses with voltages $V_a$ and $V_b$ at 29 V and 20 V, respectively. Within the given equipment's resolution of measurement, the device switched from OFF to ON over 311 ns. During this measurement, the equipment was configured to apply a 150 ns voltage pulse. However, the pulsed voltage itself had rise/fall times of ~150 ns, which consumed much of the resulting pulse width of more than 300 ns, and severely limiting measurement capability. Therefore, this switching time represents an upper bound of actual switching times, indicating much faster switching speeds in actuality.

FeRh phase transitions are known to occur on sub-picosecond time scales, suggesting that the operational limit for the subject device utilizing FeRh transition may in practice well exceed GHz operating speeds, provided sufficient thermal sinking by the substrate. The subject device may be optimized in this regard. This is evident from an evaluation of power switching losses that occur during phase transition.

Device power consumption for the sample case illustrated in FIGS. 5(a)-5(d) was calculated for ON ($P_{ON}$) and OFF ($P_{OFF}$) states, as well as during turn-ON ($P_{s,ON}$) and turn-OFF ($P_{s,OFF}$) switching cycles using Equations 2-5.

$$P_{ON} = V_b I_{ON} \qquad (2)$$

$$P_{OFF} = V_b I_{OFF} \qquad (3)$$

$$P_{s,ON} = \frac{1}{T_{s,ON}}[(t_2 - t_1)(I_{s,ON} - I_{OFF})(V_{a,ON} - V_b) + \qquad (4)$$
$$(t_3 - t_2)I_{s,ON}V_{a,ON} + (t_4 - t_3)(I_{s,ON} - I_{ON})(V_{a,ON} - V_b)]$$

$$P_{s,OFF} = \frac{1}{T_{s,OFF}}[(t_6 - t_5)(I_{ON} - I_{s,OFF})(V_b - V_{a,OFF}) + \qquad (5)$$
$$(t_7 - t_6)I_{s,OFF}V_{a,OFF} + (t_8 - t_7)(I_{OFF} - I_{s,OFF})(V_b - V_{a,OFF})]$$

Here, Ts represents the switching pulse period, $t_i$ represents the pulsed waveform timings, $I_{ON}$ and $I_{OFF}$ represent steady state current amplitudes, and $I_{s,ON}$ and $I_{s,OFF}$ represent switching current amplitudes resulting from pulsed voltages $V_{a,ON}$ and $V_{a,OFF}$, respectively. The value of each parameter is shown in FIG. 5(d). Using these parameters, $P_{ON}$, $P_{OFF}$, $P_{s,ON}$, and $P_{s,OFF}$ were found to be 63.105 mW, 54.763 mW, 57.780 mW, and 23.821 mW, respectively.

The switching properties of FeRh are known in the art to be comparable to or better than numerous other phase-change memory materials known in the art. Among these, $Ge_2Sb_2Te_5$ is the most commonly used active layer material in phase change memory applications, and has reported read/write times of 150 to 200 ns. $TiO_x$ is commonly used for developing memristor networks requiring more complex architectures because it can provide low variability across the area of a chip. For instance, a known $TiO_2$-based memristor provides an $R_{OFF}/R_{ON}$ and write time of 10 and 200 ns, respectively. $HfO_2$ is another commonly used memristor active layer material because of high $R_{OFF}/R_{ON}$ and turn-on slopes of over ten orders of magnitude and 1 mV/decade, respectively. Despite the more intricate architectures of these memory devices, the 311 ns write time demonstrated for subject switching device is comparable in switching speed performance.

The subject switching device may require optimization to maximize $R_{OFF}/R_{ON}$, minimize the relatively high steady-state power consumption ($P_{OFF}$=54.763 mW and $P_{ON}$=63.105 mW), and ultimately achieve sub-ns switching speeds. There are several approaches for realizing these optimizations. The $R_{OFF}/R_{ON}$ ratio could be magnified by incorporation into tunneling magnetoresistance type sensors, where the dependence of the tunneling mechanism on the magnetic properties may result in orders of magnitude larger MR changes. The power consumed is dominated by $V_b$ since the pulsed waveform has such a small duty cycle, and the baseline voltage is necessary since it keeps the device temperature near the phase transition. By tuning the width and temperature onset of the FeRh transition, as well as the wire geometry, the required baseline voltage may be drastically reduced. This would also allow for a reduced ON-state power, given that a smaller pulse would be needed to switch states. The transition temperature of FeRh could also be tuned to lower temperatures by altering the $Fe_xRh_{1-x}$ composition during growth. The transition temperature is known to be controllable over a 80 K range by varying the Fe content from x=0.40-0.49 or by He-ion implantation. This would greatly reduce the required $V_b$ and hence the static power consumption. As an example of a potential enhancement in device operating properties in the subject switching device, the ON-state power may be reduced by ~32% to 43 mW by lowering $V_b$ to 15 V.

The switching speeds of the sample cases of the disclosed embodiment are comparable to those of conductive filament memristors known in the art, which range from milliseconds to nanoseconds and vary depending on the thickness of the switching medium layer. Further reducing the pulse width to the transition speed limit could result in probabilistic switching, allowing for applications of these devices in neuromorphic computing. Existing neuromorphic transistors are known to operate with speeds from kilohertz up to megahertz. The subject device is therefore at least as fast in switching speed as other state-of-the-art devices heretofore known. The 400 K operating temperature used for device proof-of-concept in FIGS. 5(a)-5(d) was chosen to simulate a realistic operating condition in computing applications. In neuromorphic applications, the ideal operating temperature in an advanced system would likely be closer to 310 K, requiring a lower power device. Further, the FeRh device of the disclosed embodiment has similar functionality to Mott transistors, which operate based on thermally-induced phase change and can be switched on a sub-ns timescale.

Moreover, the FeRh portion of the subject device is not likely to experience oxidation effects within the heating/cooling ranges that may be encountered in typical applications (on the order of about 400 K plus the Joule heating contribution). Because there are no stable compounds containing Fe, Rh, and O, oxidation may only occur when the Fe—Rh bond is broken. The Fe—Rh bond has a formation energy of –0.055 eV, which is equivalent to the energy provided by a temperature of 638 K. And the subject device was found to withstand temperatures as high as 480 K under experimental conditions. It is not likely to suffer Fe—Rh decomposition in the wide range of contemplated applications. Additionally, a nonvolatile FeRh device may be formed capable of storing memory at zero current which can only be erased by cooling.

FIGS. 6(a)-6(d) illustrate various properties and features obtained from sample thermal modeling of the disclosed embodiment. FIG. 6(a) illustrates experimental conductivity measurements during heating and cooling of the device, with linear fitting of the conductivity data points in AFM and FM states indicated by dotted lines. FIG. 6(b) illustrates simulated FeRh wire resistance results as a function of substrate temperature for varying current densities. The inset view shows temperature profiles for a sample substrate of MgO material while a current density of 4 $MA/cm^2$ is applied at fixed bottom surface temperatures of (i) 350 K, (ii) 400 K, (iii) 450 K, and (iv) 500 K. FIG. 6(c) illustrates simulated FeRh wire resistance results as a function of applied current density for a 1-μm-wide wire of varying lengths. FIG. 6(d) illustrates simulated FeRh wire resistance results as a function of applied current density for a 100 μm long wire of varying widths. Data shown in FIGS. 6(b) and 6(c) was obtained for a substrate temperature of 400 K.

FIG. 6(a) shows the temperature-dependent conductivity functions used to model the heat transfer physics. Here, the temperature-dependent conductivity of the MPT portion's FeRh material in the AFM and FM states is defined by respective curves for the heating and cooling transitional directions. These conductivity curves/functions were obtained by fitting the temperature-dependent conductivity data points of the sample MPT portion in the respective states at temperatures above and below its metamagnetic transition temperature. To transition between the two states, a boundary ordinary differential equation constraint was defined in the model which set a state variable to 1 or 0 corresponding with the AFM and FM states, respectively. One state variable value would cause the magnetic domain to follow the AFM temperature-dependent conductivity function while the other state variable value would cause the magnetic domain to follow the FM temperature-dependent conductivity function. An abrupt transition results between the two states solely dependent on the transition temperature of the domain.

The transition temperature of each domain was defined by three parameters. The first two parameters were global, defining the transition from AFM to FM (430 K) along with the transition from FM to AFM (420 K). The difference between these two parameters yields hysteresis in the metamagnetic transition temperature. Additionally, a random variable was assigned to each FeRh domain, seeded by the domain coordinates to keep it fixed for each sampling. Each domain was then sampled from a standard normal distribution, yielding a mean temperature shift of 0 K with ±1 standard deviation corresponding with a ±10 K shift. This random parameter caused each FeRh domain to transition at different temperatures, yielding a gradual change in the total wire resistance sampled at the wire terminals. Programmatically, FeRh wire and metal contacts were treated as layered materials, thus accounting for their thickness analytically, thereby avoiding the need to mesh them in the out-of-plane direction. Therefore, each mesh element in the FeRh wire region was treated for illustration purposes as an individual domain with the maximum domain size ranging from 100 nm to 250 nm.

In the model, distinct thermal conductivity and heat capacity parameters were selected for each material. At 400 K the thermal conductivity of FeRh is known to vary from about 31.8 W/m-K to 65.8 W/m-K for AFM and FM phases, respectively. For purposes of illustration, a thermal conductivity value of 50 W/m-K was selected since the MPT portion containing FeRh in the disclosed embodiment is mainly operated within the AFM-FM transition range. The FeRh material's heat capacity was set for example to vary with temperature according to:

$$Cp_{FeRh}\left[\frac{J}{kgK}\right] = 252 + 6.3(T - 150)^{0.952} \qquad (6)$$

The thermal conductivity of the MgO substrate was set according to:

$$K_{MgO}\left[\frac{W}{mK}\right] = \frac{14905\frac{W}{m}}{T} - \left(0.10272\frac{W}{m}\right)T^{0.41267} \qquad (7)$$

And the heat capacity of the MgO substrate was set according to:

$$Cp_{MgO}\left[\frac{J}{kgK}\right] = \qquad (8)$$

$$47.260 + 5.682\frac{T}{10^3} - 0.873\left(\frac{T}{10^3}\right)^2 + 0.104\left(\frac{T}{10^3}\right)^3 - 1.054\left(\frac{10^3}{T}\right)^2$$

These parameters were found to vary with temperature as expected. The thermal conductivity and heat capacity of the gold contacts were at 310 W/m-K and 128 J/kg-K, respectively.

FIG. 6(b) shows the resistance of a 10 μm×100 μm wire configurations of the device under different DC bias conditions as the substrate temperature is increased. The resulting curves serve to substantiate the modeling approach. The simulated wire dimensions and biasing conditions closely match those of FIG. 2(a). The simulation indeed captures the primary behavior observed for physical samples under experimental conditions. In particular, a hysteresis of approximately 10-15 K is observed, as are a reduction in the onset of transition temperature with DC bias and an increase in the transition width with DC bias, consistent with physically measured results. The temperature-dependent behavior of the FeRh wire device was also found to be highly dependent on the ability of the substrate to dissipate current-induced heating.

The inset images in FIG. 6(b) schematically illustrate volume temperature contour plots within the MgO substrate for the FeRh wire device configuration while under a fixed current load of 4 MA/cm$^2$ at different substrate temperatures as labeled. For the 1.0 MA/cm$^2$ condition, the substrate temperature at which the minimum resistance occurs is approximately 440 K. This is approximately 2 standard deviations above the mean transition temperature and correlates to a FM domain transition percentage of >97%. At 2.5 MA/cm$^2$, 4.0 MA/cm$^2$, and 5.0 MA/cm$^2$, the substrate temperature at which the minimum terminal resistance occurs decreases from 415 K to 375 K, then to 340 K, respectively. Simultaneously, the thermal profile originating at the FeRh wire device and extending down into the substrate is clearly apparent. More rapid thermal equilibration within the substrate would lessen the thermal gradient experienced in the wire and concomitantly reduce the amplitude of Joule-heating-induced shift of the minimum resistance temperature. The opposite is also true, whereby a slower thermal equilibration would yield even greater thermal gradients at the expense of slower thermal constants for the wire/substrate system.

In FIG. 6(c) the simulated wire resistance is plotted as a function of current density for 1 μm-wide wire device sample cases having lengths of 2.5 μm, 5 μm, 10 μm, and 50 μm. Consistent with the experimental data for a physical sample illustrated in FIG. 2(b), the simulated wire devices exhibit a reduction in the current at which the minimum conductivity is observed, and a decreased JCr, signifying the onset of metamagnetic transition. At only 1 μm wide, the shorter wire device sample cases also begin to display stepwise resistance fluctuations since the transition of individual domains provide greater contributions to the overall resistance. In FIG. 6(c) a maximum domain size of 100 nm was used to ensure the width of the simulated wire device contained at least 10 elements. For FIG. 6(b) a maximum domain size of 250 nm was used since the wire device cases were of 10 μm width and fixed length of 100 μm. FIG. 6(d) shows the simulated wire resistance plotted as a function of current density for 100 μm-long wires having widths of 0.3 μm, 1.0 μm, 10 μm, 25 μm, and 50 μm.

Figure 7A:
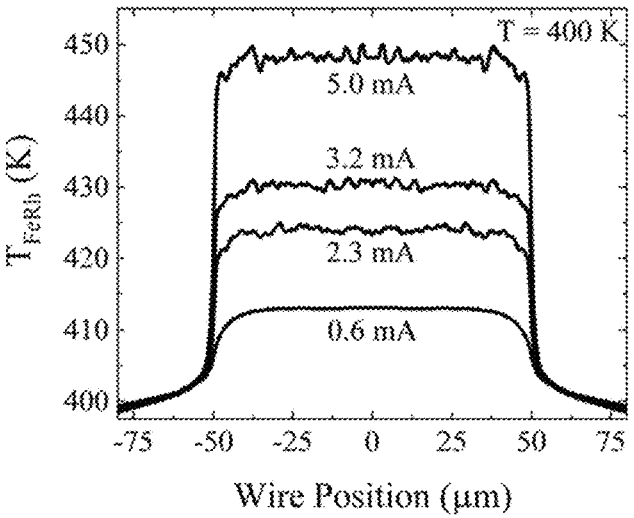
FIG. 7(*a*) is a schematic diagram illustrating position-dependent temperature profiles at a certain substrate temperatures and different current amplitudes for a sample application of a switching device such as shown in FIG. 1(*b*) in a computer simulated application.
Figure 7B:
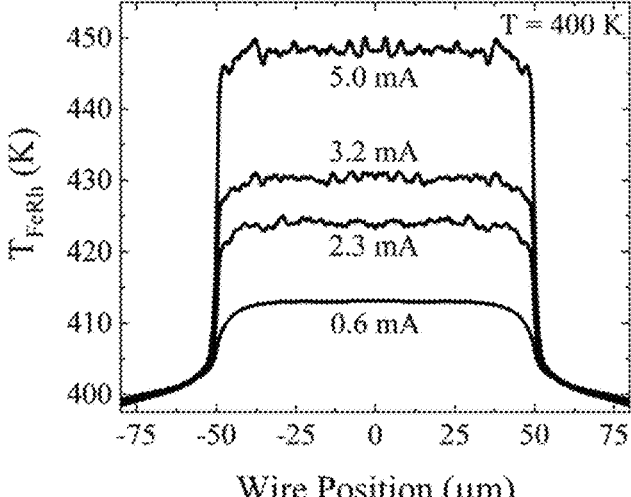
Figure 7C:
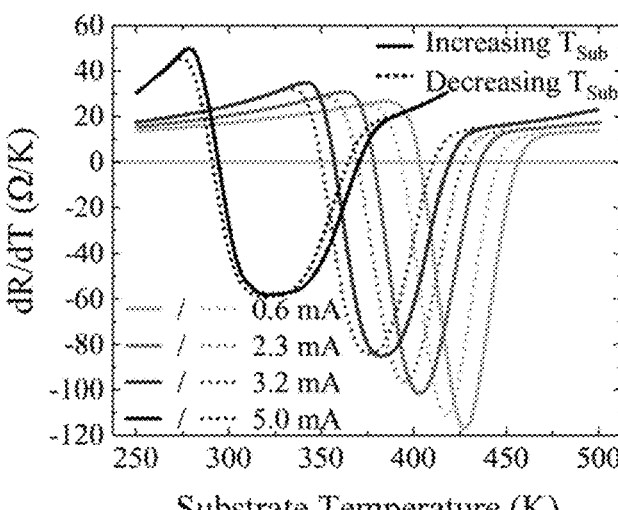

FIGS. 7(a)-7(c) illustrate position-dependent variations in certain properties and features obtained from sample modeling of the disclosed embodiment. FIGS. 7(a) and 7(b) show position-dependent temperature profiles for different substrate temperatures (250 K and 400 K) due to different current amplitudes through the device's conduction path. The data shown here corresponds to that of FIG. 6(b), and indicate significant heatsink-effects at the metal contact/FeRh interface. FIG. 7(c) shows the first derivative of resistance with respect to temperature, dR/dT, based on data from FIG. 6(b). Here a 'plateau' region is evident which widens as the current amplitude is increased.

In FIGS. 7(a) and 7(b) temperature profile within the sample model again having a wire configuration with an FeRh MPT portion (x-axis positions ≤|50| μm) extending between Au contacts/terminals disposed on either side (x-axis positions ≥|50| μm) at respective substrate temperatures of 250 K and 400 K. The temperature profile within the MPT portion is nearly constant, and defines a temperature plateau. Near the metal contacts (within ±50 μm) the temperature abruptly decreases as the temperature equilibrates with the substrate temperature. This effect is consistent up to a distance of about 25 μm from a metal contact/FeRh interface. Joule heating causes the plateau amplitude to increase and also causes plateau rounding near the metal contact/FeRh interface. During thermal cycling simulation, these profiles are effectively shifted vertically toward higher temperatures. Then upon reaching the metamagnetic transition temperature, the rate at which this shift occurs begins to slow since the wire resistance and power dissipated by Joule heating (I$^2$R) decreases.

This is reflected by the first derivative of the terminal resistance with respect to temperature as shown in FIG. 7(c). Generally, the value of dR/dT>0 due to the positive temperature coefficient of resistance in the given sample. However, as the wire transitions from AFM to FM phase, an abrupt decrease in dR/dT occurs, such that it becomes less than 0 in value. Further increasing the substrate temperature, the value increases to dR/dT>0 once the AFM-FM transition is complete. For I=0.60 mA, the dR/dT transition window is relatively abrupt and the width (temperature T=395 K to 455 K) greatly exceeds the plateau temperature of the MPT portion. The dR/dT value for a low current sweep thus traces, in effective, the probability distribution of a domain in the AFM state to transition to the FM state. Upon increasing the current, the dR/dT minima shift to lower temperatures since less substrate heating is needed to reach the transition.

As shown in FIG. 7(c), these various trends correlate quite well. Broadening of the dR/dT transition region is caused in part by the increased curvature of the temperature plateaus near the metal contact/FeRh interface. Away from the metamagnetic transition, the resistance should vary about linearly with temperature, leading to a constant dR/dT. However, a slight linear increase is observed in the data. This linear increase is due to the thermal feedback in the model where an increased substrate temperature causes an increased resistance, which in turn causes increased Joule heating. More Joule heating increases the local wire temperature and further increases the resistance. The increased local resistance is scaled by $I^2$ and therefore increases with current density.

Figure 8A:
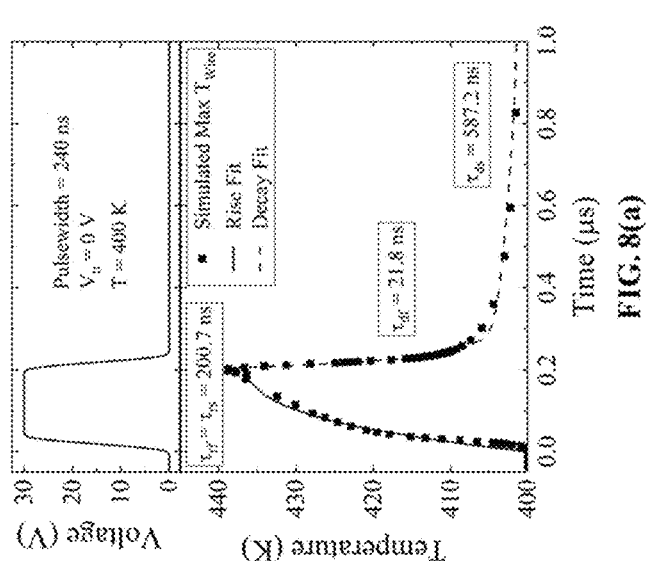
FIG. 8(*a*) is a schematic diagram illustrating transient temperature response to pulsed voltage stimulation for determining a heat dissipation time constant in a sample application of a switching device such as shown in FIG. 1(*b*) in a computer simulated application.
Figure 8C:
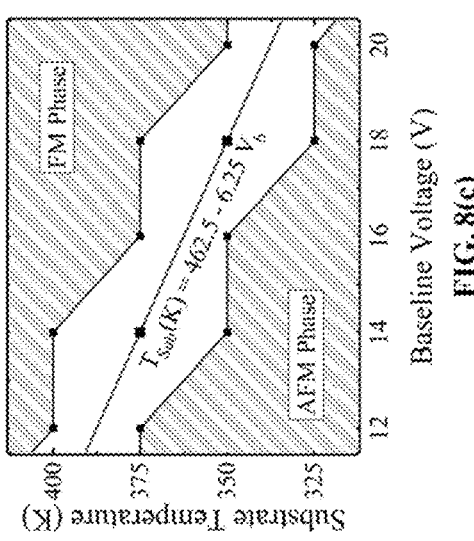
Figure 8B:
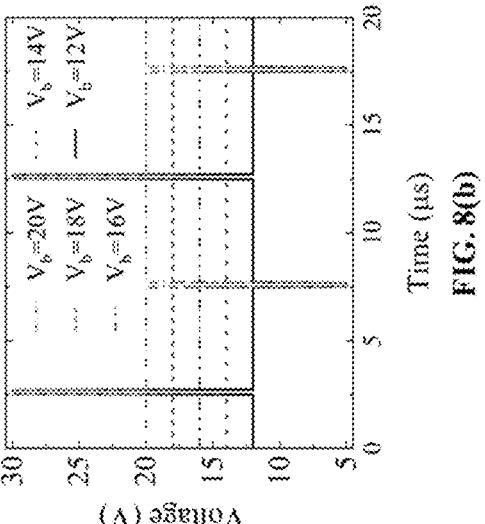
Figures 8D, 8E, 8F, 8G, 8H, 8I:
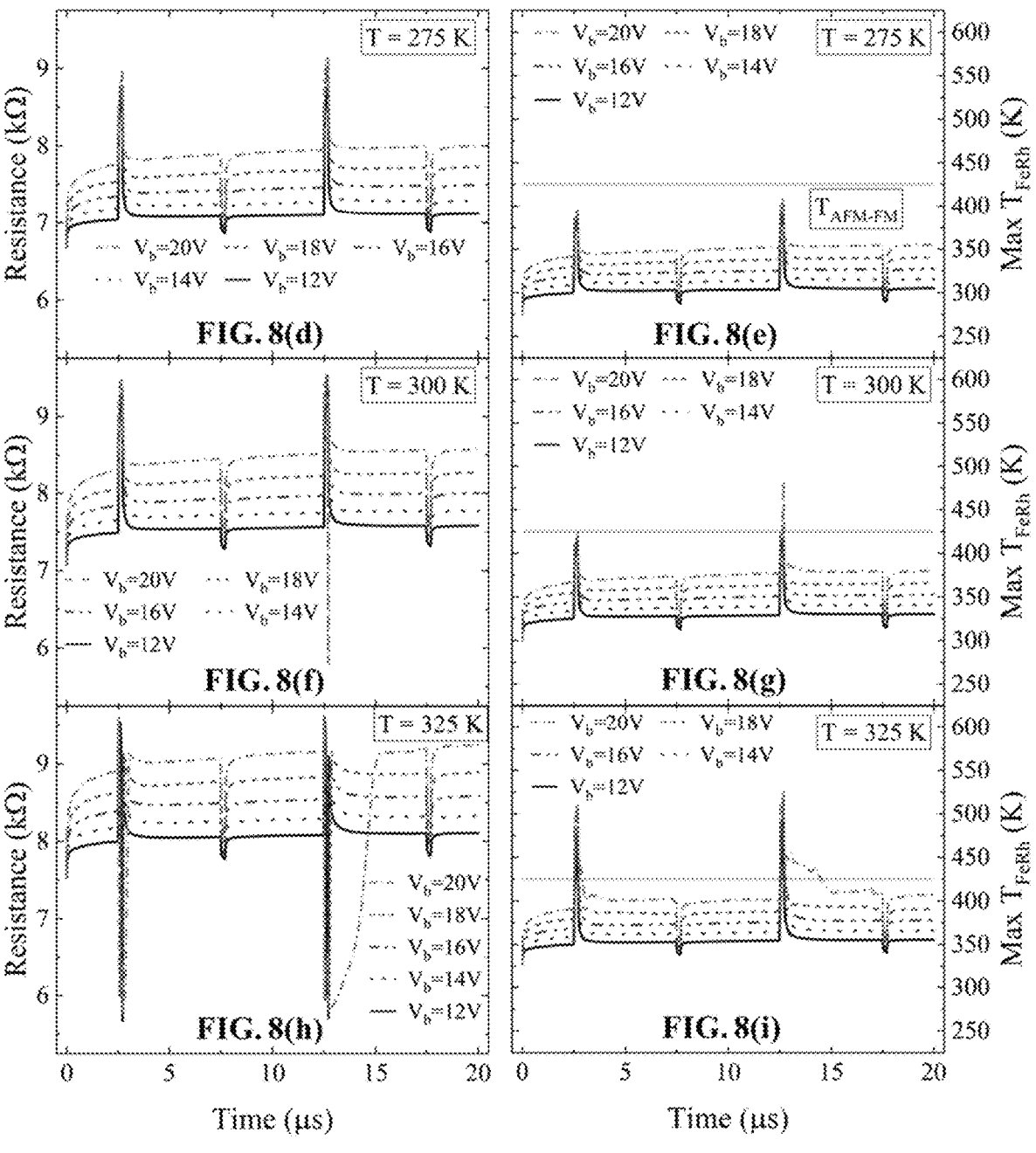

FIGS. 8(a)-8(o) illustrate various transient modeling results also from a simulated sample of the disclosed embodiment. FIG. 8(a) illustrates MPT portion (or FeRh wire) heat dissipation time constant. FIG. 8(b) illustrates various simulated voltage pulse profiles. FIG. 8(c) illustrate compiled AFM-FM transition dynamics obtained from the modeled results shown in FIGS. 8(d)-8(o). The simulated transient data includes the MPT portion's resistance and maximum temperature.

FIG. 8(a) shows simulation results where a 30 V voltage pulse of 240 ns in pulse width is applied to the wire having a bias voltage $V_b$ of 0 V. Heat dissipation time constants may be extracted from the transient profile according to:

$$T_{rise} = T_0 + A_f e^{-\frac{x}{\tau_{rf}}} + A_s e^{-\frac{x}{\tau_{rs}}} \tag{9}$$

and $$T_{decay} = T_0 + B_f e^{-\frac{x}{\tau_{df}}} + B_s e^{-\frac{x}{\tau_{ds}}} \tag{10}$$

where the time constant abbreviations of r, d, f, and s represent rise, decay, fast, and slow, respectively. The time constants were found to be $\tau_{rf}=\tau_{rs}=200$ ns, $\tau_{df}=21.8$ ns, and $T_{ds}=587.2$ ns. This means that when a 30 V bias is applied with $V_b=0$ V, the wire temperature is elevated through Joule heating by nearly 40 K over 200 ns. Then, upon removing the 30 V bias, the heat is dissipated from the wire in 587 ns, with approximately 87.5% of the generated heat being dissipated in just 21.8 ns.

Next, state-switching capability is simulated at substrate temperatures and baseline voltages ranging from 275-400 K and 12-20 volts, respectively, by applying the pulsed waveforms shown in FIG. 8(b). The findings are summarized in FIG. 8(c), and the transient resistance and FeRh wire temperature plots responsive to pulsed changes in baseline voltage are shown in FIGS. 8(d)-8(o). At temperatures of 275 K (FIGS. 8(d), 8(e)) and 300 K (FIGS. 8(f), 8(g)) the FeRh wire portion was unable to switch into the FM state regardless of $V_b$ due to the low substrate temperature. At 325 K (FIGS. 8(h), 8(i)) AFM-FM modulation begins at $V_b=20$ V, but the low substrate temperature allows the FeRh wire portion to cool back into the AFM state when no switching bias is applied. State-switching is observed when the substrate temperature is increased to 350 K (FIGS. 8(j), 8(k)) and 375 K (FIGS. 8(l), 8(m)) when baseline voltages of 18 V and 14 V, respectively, are applied.

At other biasing conditions, the FeRh wire portion is either locked into the AFM or FM phase. For example, at 400 K (FIGS. 8(n), 8(o)) the FeRh wire portion immediately enters the FM phase, but is unable to switch back to AFM as the substrate temperature remains too high. FIG. 8(c) shows substrate temperature versus baseline voltage with AFM, FM, and AFM-FM modulation conditions plotted. In the shaded $T_{sub}$-$V_b$ regions shaded below and above the unshaded intermediate transition region, the FeRh wire portion remains locked in the AFM and FM phases, respectively. It is in-between these two regions, within the intermediate transition region, that AFM-FM modulation occurs.

The magnetic transitions occurring within this regions may be described by:

$$T(K)=462.5K-(6.25K \ V^{-1})V_b \tag{11}$$

as acquired by curve fitting the data points shown in the plot of FIG. 8(c).

Figures 9A, 9B:
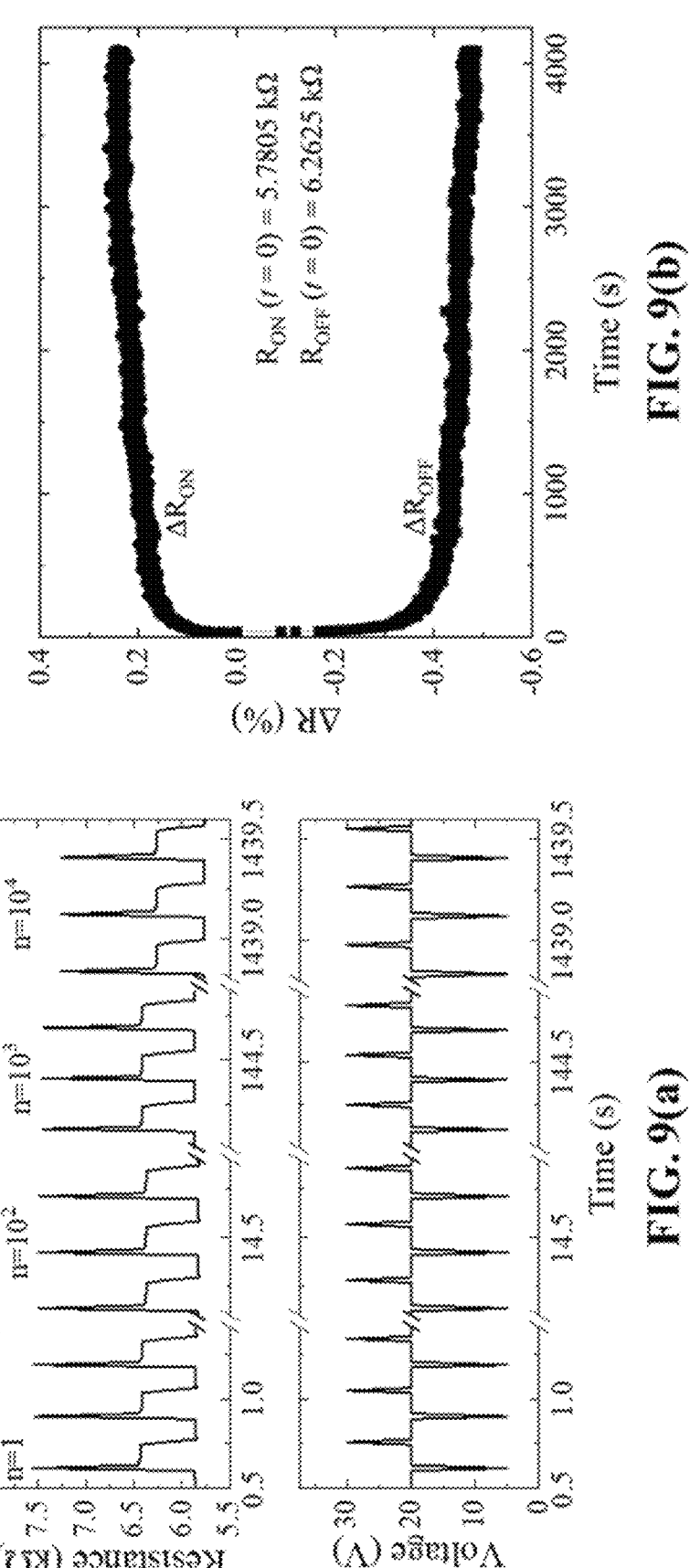
FIG. 9(*a*) is a schematic diagram illustrating resistance endurance of the MPT portion through pulsed voltage stimulated switching between the two device states for more than a certain number of cycles for a sample application of a switching device such as shown in FIG. 1(*b*) in a computer simulated application; and, FIG. 9(*b*) is a schematic diagram illustrating device state retention in response to switching into a desired state then monitoring transient resistance over a certain extended time period for a sample application of a switching device such as shown in FIG. 1(*b*) in a computer simulated application.

FIGS. 9(a)-9(b) illustrate certain switching endurance and state retention parameter values obtained from a sample of the disclosed embodiment. FIG. 9(a) illustrates FeRh MPT portion endurance in response to switching between the two device states for more than $1\times10^4$ cycles, over which minimal change in resistance is observed. FIG. 9(b) illustrates device state retention in response to switching into a desired state then monitoring transient resistance over a time period of more than one hour. The resistance reaches saturation before the end of the one-hour measurement period, with $R_{OFF}$ decreasing by about 24Ω (0.47%) from its initial value, while $R_{ON}$ increased by about 12Ω (0.24%) from its initial value.

The device switching endurance and state retention properties reflected in FIGS. 9(a) and 9(b), respectively, were obtained using the same experimental conditions described for the measurement of FIG. 5(b). No noticeable change in the device performance is observed when subjected to more than $1\times10^4$ switching cycles. Nor is any noticeable change in device performance observed in state retention response upon switching into a desired phase then monitoring (resistance or other such indicative parameter) as a function of time for more than one hour. In either case, the resistance reached saturation before the end of the one-hour measurement period. As noted, both the OFF resistance $R_{OFF}$ and the ON resistance $R_{ON}$ of the device varied by less than 1% from their initial values over the observed period.

Although this invention has been described in connection with specific embodiments and forms thereof, it will be appreciated that various modifications other than those described or mentioned above may be resorted to without departing from the spirit or scope of the invention as defined in the appended claims. For example, functionally equivalent elements may be substituted for those specifically shown and described, certain features may be used independently of other features, and in certain cases, particular locations of elements or particular ordering of method steps or processes may be reversed or interposed, all without departing from the spirit or scope of the invention as defined in the appended claims.

What is claimed is:

1. A device for high speed metamagnetic resistive switching, comprising:

a substrate;

first and second terminals formed on said substrate; and, at least one metamagnetic phase transitioning (MPT) portion formed on said substrate, said MPT portion being coupled to said first and second terminals to define an electrical conduction path in resistivity adjustable manner therebetween;

wherein said MPT portion is selectively tuned for temperature-responsive phase transitions bidirectionally between predetermined first and second magnetic phases through an intermediate phase, first and second phase boundaries being defined between the intermediate phase and the first and second magnetic phases respectively, the first and second phase boundaries each being traversed at different critical temperatures depending on direction of traversal, the different critical temperatures for each of the first and second phase boundaries being mutually offset by a hysteretic shift;

wherein said MPT portion is boosted in magnetic phase across the first phase boundary responsive to thermal actuation pulsed in a first direction to reach or exceed both the critical temperatures of the first phase boundary in the first direction, and across the second phase boundary responsive to thermal actuation pulsed in a second direction to reach or exceed both the different critical temperatures of the second phase boundary in the second direction, the electrical conduction path of said MPT portion being thereby adjusted in resistivity for switching between ON and OFF states; and, wherein the pulsed thermal actuation includes pulsed energization applied across said first and second terminals, the pulsed energization being adaptively tuned in amplitude to define separately adjusted peak amplitudes in the first and second directions relative to a predetermined baseline amplitude, said MPT portion at the predetermined baseline amplitude being biased to the intermediate phase, whereby the peak amplitudes may be different in the first and second directions depending on the predetermined baseline amplitude.

2. The device as recited in claim 1, wherein:

said MPT portion is switched from an OFF state to an ON state responsive to thermal actuation pulsed to raise said MPT portion in temperature up to at least the higher of the critical temperatures for one of the first and second boundaries, and switched from the ON state to the OFF state responsive to thermal actuation pulsed to lower said MPT portion in temperature down to at least the lower of the critical temperatures for the other of the first and second boundaries; and, said MPT portion in the first magnetic phase substantially defines an antiferromagnetic (AFM) domain and in the second magnetic phase substantially defines a ferromagnetic (FM) domain; and, said MPT portion varies in resistivity through the intermediate phase in substantially linear response to variation in temperature, said MPT having different resistivity values mutually offset by a hysteretic shift depending on direction of magnetic phase transition into the intermediate phase.

3. The device as recited in claim 2, wherein said MPT portion is formed substantially of a metallic material.

4. The device as recited in claim 3, wherein the metallic material of said MPT portion includes an FeRh material.

5. The device as recited in claim 4, wherein the critical temperature for traversal is greater at each of the first and second phase boundaries for a rising direction of temperature change towards the FM phase than for a lowering direction of temperature change towards the AFM phase.

6. The device as recited in claim 4, wherein the pulsed energization includes resistive heating by applying a pulsed voltage signal between said first and second terminals coupled to said MPT portion.

7. The device as recited in claim 1, wherein said MPT portion is selectively tunable in phase transitioning response based on at least one of a plurality of predetermined tuning parameters including substitutional doping, material strain, and geometric patterning.

8. The device as recited in claim 1, wherein said MPT portion is configured to retain the electrical conduction path in one of the ON and OFF states when stabilized in temperature to remain magnetically within the intermediate phase.

9. A two terminal switching device having high speed metamagnetic resistive switching between predetermined ON and OFF states for memory, comprising:

a substrate;

first and second terminals formed on said substrate; and, at least one metamagnetic phase transitioning (MPT) portion formed on said substrate, said MPT portion being formed of a metallic material and coupled to said first and second terminals to define an electrical conduction path in resistivity adjustable manner therebetween;

wherein said MPT portion is selectively tuned for temperature-responsive bidirectional transitions in phase between antiferromagnetic (AFM) and ferromagnetic (FM) phases through an intermediate phase, a first phase boundary being defined between the AFM phase and the intermediate phase and a second phase boundary between the intermediate phase and the FM phase, the first and second phase boundaries each being traversed at different critical temperatures depending on direction of traversal, the different critical temperatures for each of the first and second phase boundaries being mutually offset by a hysteretic shift;

wherein said MPT portion is driven in magnetic phase between the intermediate and FM phases to switch the electrical conduction path in resistivity from the OFF state to the ON state responsive to pulsed energization for raising said MPT portion in temperature up to at least the higher of the critical temperatures for the second boundary, said MPT portion being driven in magnetic phase between the intermediate and AFM phases to switch the electrical conduction path in resistivity from the ON state to the OFF state responsive to pulsed energization for lowering said MPT portion in temperature down to at least the lower of the critical temperatures for the first boundary; and, wherein the pulsed energization is applied across said first and second terminals, the pulsed energization being adaptively tuned in amplitude to define separately adjusted peak amplitudes in opposing directions relative to a predetermined baseline amplitude for raising and lowering the temperature of said MPT portion, said MPT portion at the predetermined baseline amplitude being biased to the intermediate phase, whereby the peak amplitudes may be different in the opposing directions depending on the predetermined baseline amplitude.

10. The device as recited in claim 9, wherein said MPT portion includes an FeRh material; and, the critical temperature for traversal is greater at each of the first and second phase boundaries for a rising direction of temperature change towards the FM phase than for a lowering direction of temperature change towards the AFM phase.

11. The device as recited in claim 10, wherein the pulsed energization includes resistive heating by applying a pulsed voltage signal between said first and second terminals coupled to said MPT portion.

12. The device as recited in claim 10, wherein said MPT portion is selectively tunable in phase transitioning response based on at least one of a plurality of predetermined tuning parameters including substitutional doping, material strain, and geometric patterning.

13. The device as recited in claim 9, wherein said MPT portion is configured to retain the electrical conduction path in one of the ON and OFF states when stabilized in temperature to remain magnetically within the intermediate phase, said MPT portion settling to a temperature within the intermediate phase responsive to either a substantially constant direct current bias of predetermined voltage or a pulsed bias of a predetermined baseline voltage applied thereacross.

14. A method for high speed metamagnetic resistive switching between predetermined ON and OFF states for memory, comprising:

establishing a substrate;

establishing first and second terminals on said substrate;

forming at least one metamagnetic phase transitioning (MPT) portion on said substrate, said MPT portion being coupled to said first and second terminals to define an electrical conduction path in resistivity adjustable manner therebetween;

selectively tuning said MPT portion for temperature-responsive bidirectional transitions in phase between antiferromagnetic (AFM) and ferromagnetic (FM) phases through an intermediate phase, said selective tuning includes:

defining first and second phase boundaries between the intermediate phase and the AFM and FM phases respectively; and, defining for each of the first and second phase boundaries different critical temperatures for traversal depending on direction of traversal, the different critical temperatures for each of the first and second phase boundaries being mutually offset by a hysteretic shift;

boosting said MPT portion in magnetic phase across the first phase boundary responsive to thermal actuation pulsed in a first direction to reach or exceed both the critical temperatures of the first phase boundary in the first direction; and, boosting said MPT portion in magnetic phase across the second phase boundary responsive to thermal actuation pulsed in a second direction to reach or exceed both the critical temperatures of the second phase boundary in the second direction;

wherein the pulsed thermal actuation includes pulsed energization applied across said first and second terminals, the pulsed energization being adaptively tuned in amplitude to define separately adjusted peak amplitudes in the first and second directions relative to a predetermined baseline amplitude, said MPT portion at the predetermined baseline amplitude being biased to the intermediate phase, whereby the peak amplitudes may be different in the first and second directions depending on the predetermined baseline amplitude;

the electrical conduction path of said MPT portion being thereby adjusted in resistivity for switching between the ON and OFF states.

15. The method as recited in claim 14, wherein:

the pulsed thermal actuation for selectively switching said MPT portion from the OFF state to the ON state includes raising said MPT portion in temperature up to at least the higher of the critical temperatures for the second boundary; and, the pulsed thermal actuation for selectively switching said MPT portion from the ON state to the OFF state includes lowering said MPT portion in temperature down to at least the lower of the critical temperatures for the first boundary.

16. The method as recited in claim 14, wherein said MPT portion varies in resistivity through the intermediate phase in substantially linear response to variation in temperature, said MPT portion being characterized at each temperature within the intermediate phase by different resistivity values mutually offset by a hysteretic shift depending on which of the AFM and FM phases said MPT portion last transitioned into the intermediate phase from.

17. The method as recited in claim 14, wherein said MPT portion is formed substantially of a metallic material.

18. The method as recited in claim 17, wherein the metallic material of said MPT portion is formed to include an FeRh material; and, said pulsed energization includes resistive heating by applying a pulsed voltage signal between said first and second terminals coupled to said MPT portion.

19. The method as recited in claim 14, wherein said MPT portion is stabilized in temperature to remain magnetically within the intermediate phase for retaining the electrical conduction path in one of the ON or OFF state, said MPT portion settling to a temperature within the intermediate phase responsive to either a substantially constant direct current bias of predetermined voltage or a pulsed bias of a predetermined baseline voltage applied thereacross.

20. The method as recited in claim 14, wherein said MPT portion is selectively tuned in phase transitioning response based on at least one of a plurality of predetermined tuning parameters including substitutional doping, material strain, and geometric patterning.

* * * * *